(12) United States Patent
Genc

(10) Patent No.: US 11,671,090 B2
(45) Date of Patent: *Jun. 6, 2023

(54) SWITCH FET BODY CURRENT MANAGEMENT DEVICES AND METHODS

(71) Applicant: pSemi Corporation, San Diego, CA (US)

(72) Inventor: Alper Genc, San Diego, CA (US)

(73) Assignee: PSEMI CORPORATION, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/386,409

(22) Filed: Jul. 27, 2021

(65) Prior Publication Data

US 2022/0038092 A1 Feb. 3, 2022

Related U.S. Application Data

(63) Continuation-in-part of application No. 16/945,283, filed on Jul. 31, 2020, now Pat. No. 11,463,087.

(51) Int. Cl.
H03K 17/16 (2006.01)
H03K 17/693 (2006.01)

(52) U.S. Cl.
CPC ......... *H03K 17/162* (2013.01); *H03K 17/693* (2013.01); *H03K 2217/0018* (2013.01)

(58) Field of Classification Search
CPC .... H03K 17/00; H03K 17/162; H03K 17/693; H03K 17/76; H03K 2217/00; H03K 2217/0018
USPC ........................................................ 327/408
See application file for complete search history.

(56) References Cited

U.S. PATENT DOCUMENTS

| | | | |
|---|---|---|---|
| 10,044,349 | B2 | 8/2018 | Scott et al. |
| 10,236,872 | B1 | 3/2019 | Willard et al. |
| 10,680,599 | B1 | 6/2020 | Syroiezhin et al. |
| 10,715,133 | B1 | 7/2020 | Scott et al. |
| 11,463,087 | B2 | 10/2022 | Genc |
| 2008/0129642 | A1 | 6/2008 | Ahn et al. |
| 2011/0260774 | A1 | 10/2011 | Granger-Jones et al. |
| 2014/0118053 | A1 | 5/2014 | Matsuno |

(Continued)

FOREIGN PATENT DOCUMENTS

| | | |
|---|---|---|
| CN | 113810034 A | 12/2021 |
| CN | 114629479 A | 6/2022 |

(Continued)

OTHER PUBLICATIONS

Ex Parte Quayle for U.S. Appl. No. 17/119,840, filed Dec. 11, 2020, on behalf of PSEMI Corporation. Mail Date: Aug. 13, 2021. 8 pages.

(Continued)

*Primary Examiner* — Diana J. Cheng
*Assistant Examiner* — Dave Mattison
(74) *Attorney, Agent, or Firm* — Steinfl + Bruno LLP

(57) ABSTRACT

Methods and devices to reduce gate induced drain leakage current in RF switch stacks are disclosed. The described devices utilize multiple discharge paths and/or less negative body bias voltages without compromising non-linear performance and power handling capability of power switches. Moreover, more compact bias voltage generation circuits with smaller footprint can be implemented as part of the disclosed devices.

22 Claims, 24 Drawing Sheets

(56) References Cited

U.S. PATENT DOCUMENTS

| | | | |
|---|---|---|---|
| 2015/0171860 A1* | 6/2015 | Blin | H03K 17/102 438/275 |
| 2015/0341026 A1 | 11/2015 | De Jongh | |
| 2016/0085256 A1 | 3/2016 | Cam et al. | |
| 2019/0245533 A1 | 8/2019 | Schleicher et al. | |
| 2019/0305768 A1 | 10/2019 | Willard et al. | |
| 2019/0305769 A1* | 10/2019 | Willard | H01L 27/0727 |
| 2020/0119731 A1 | 4/2020 | Teggatz et al. | |
| 2020/0382114 A1* | 12/2020 | Scott | H03K 17/567 |
| 2021/0391858 A1 | 12/2021 | Shapiro et al. | |
| 2022/0038097 A1 | 2/2022 | Genc et al. | |
| 2022/0038099 A1 | 2/2022 | Genc | |
| 2022/0190826 A1 | 6/2022 | Willard | |

FOREIGN PATENT DOCUMENTS

| | | | |
|---|---|---|---|
| JP | 2010010728 A | 1/2010 | |
| KR | 100916472 B1 | 9/2009 | |
| KR | 102034620 B1 | 11/2019 | |
| WO | 2021/257602 A1 | 12/2021 | |
| WO | 2022/035603 A1 | 2/2022 | |
| WO | 2022/125274 A1 | 6/2022 | |

OTHER PUBLICATIONS

International Search Report and Written Opinion for International PCT Application No. PCT/US2021/037479 filed on Jun. 15, 2021 on behalf of pSemi Corporation, dated Oct. 7, 2021. 8 pages.
Non-Final Office Action for U.S. Appl. No. 16/902,032, filed Jun. 15, 2020 on behalf of PSEMI Corporation, dated Jan. 8, 2021. 15 Pages.
Non-Final Office Action for U.S. Appl. No. 16/945,283, filed Jul. 31, 2020 on behalf of PSEMI Corporation, dated Mar. 2, 2021. 24 pages.
Notification of Preliminary Examination for CN Application No. 202110662394.7 filed of Jun. 15, 2021, on behalf of PSEMI Corporation, dated Jul. 29, 2021. CN Original+ English Translation. 2 Pages.
Restriction Requirement for U.S. Appl. No. 17/119,840, filed Dec. 11, 2020 on behalf of PSEMI Corporation, dated May 17, 2021. 6 pages.
Final Office Action for U.S. Appl. No. 16/902,032, filed Jun. 15, 2020 on behalf of pSemi Corporation, dated Oct. 15, 2021. 17 Pages.
Final Office Action for U.S. Appl. No. 16/945,283, filed Jul. 31, 2020, on behalf of PSEMI Corporation, dated Dec. 3, 2021. 31 Pages.
International Search Report and Written Opinion for International Application No. PCT/US2021/059387 filed on Nov. 15, 2021 on behalf of PSEMI Corporation, dated Mar. 8, 2022. 9 pages.
International Search Report and Written Opinion for International PCT Application No. PCT/US2021/043544 filed on Jul. 28, 2021 on behalf of pSemi Corporation, dated Feb. 8, 2022. 12 Pages.
International Search Report and Written Opinion for International PCT Application No. PCT/US2021/043544 filed on Jul. 28, 2021 on behalf of pSemi Corporation, dated Jan. 21, 2022. 10 Pages.
Non-Final Office Action for U.S. Appl. No. 16/902,032, filed Jun. 15, 2020 on behalf of pSemi Corporation, dated Mar. 29, 2022. 14 Pages.
Notice of Allowance for U.S. Appl. No. 17/119,840, filed Dec. 11, 2020, on behalf of PSEMI Corporation, dated Jan. 19, 2022. 6 Pages.
Notice of Allowance for U.S. Appl. No. 17/119,840, filed Dec. 11, 2020, on behalf of PSEMI Corporation, dated Oct. 22, 2021. 5 Pages.
Notification of Passing Preliminary Examination issued for Chinese Application No. CN 202111500870.1 filed on Dec. 9, 2021 on behalf of PSEMI Corporation, dated Jan. 29, 2022. 2 Pages. CN original + English Translation. 2 Pages.
Corrected Notice of Allowability for U.S. Appl. No. 16/945,283, filed Jul. 31, 2020 on behalf of PSEMI Corporation dated Jul. 25, 2022. 4 pages.
Non-Final Office Action for U.S. Appl. No. 17/119,840, filed Dec. 11, 2020 on behalf of PSEMI Corporation dated Apr. 18, 2022. 10 pages.
Non-Final Office Action for U.S. Appl. No. 17/386,374, filed Jul. 27, 2021 on behalf of PSEMI Corporation dated Jul. 15, 2022. 29 pages.
Notice of Allowance for U.S. Appl. No. 16/902,032, filed Jun. 15, 2020, on behalf of pSemi Corporation, dated Sep. 28, 2022. 9 Pages.
Notice of Allowance for U.S. Appl. No. 16/945,283, filed Jul. 31, 2020 on behalf of PSEMI Corporation dated May 10, 2022. 12 pages.
Notice of Allowance for U.S. Appl. No. 17/119,840, filed Dec. 11, 2020 on behalf of PSEMI Corporation dated Nov. 2, 2022. 8 pages.

* cited by examiner

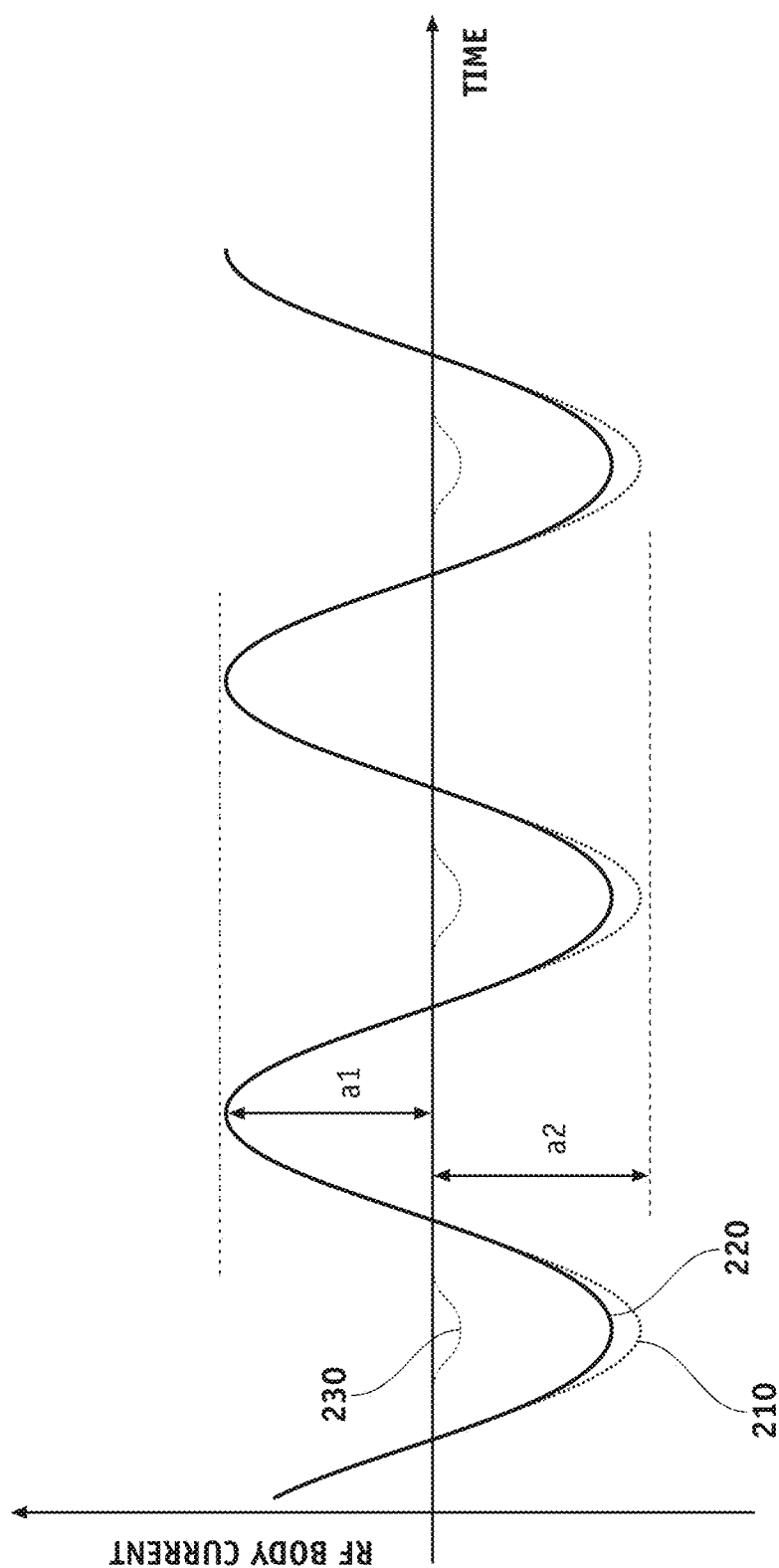

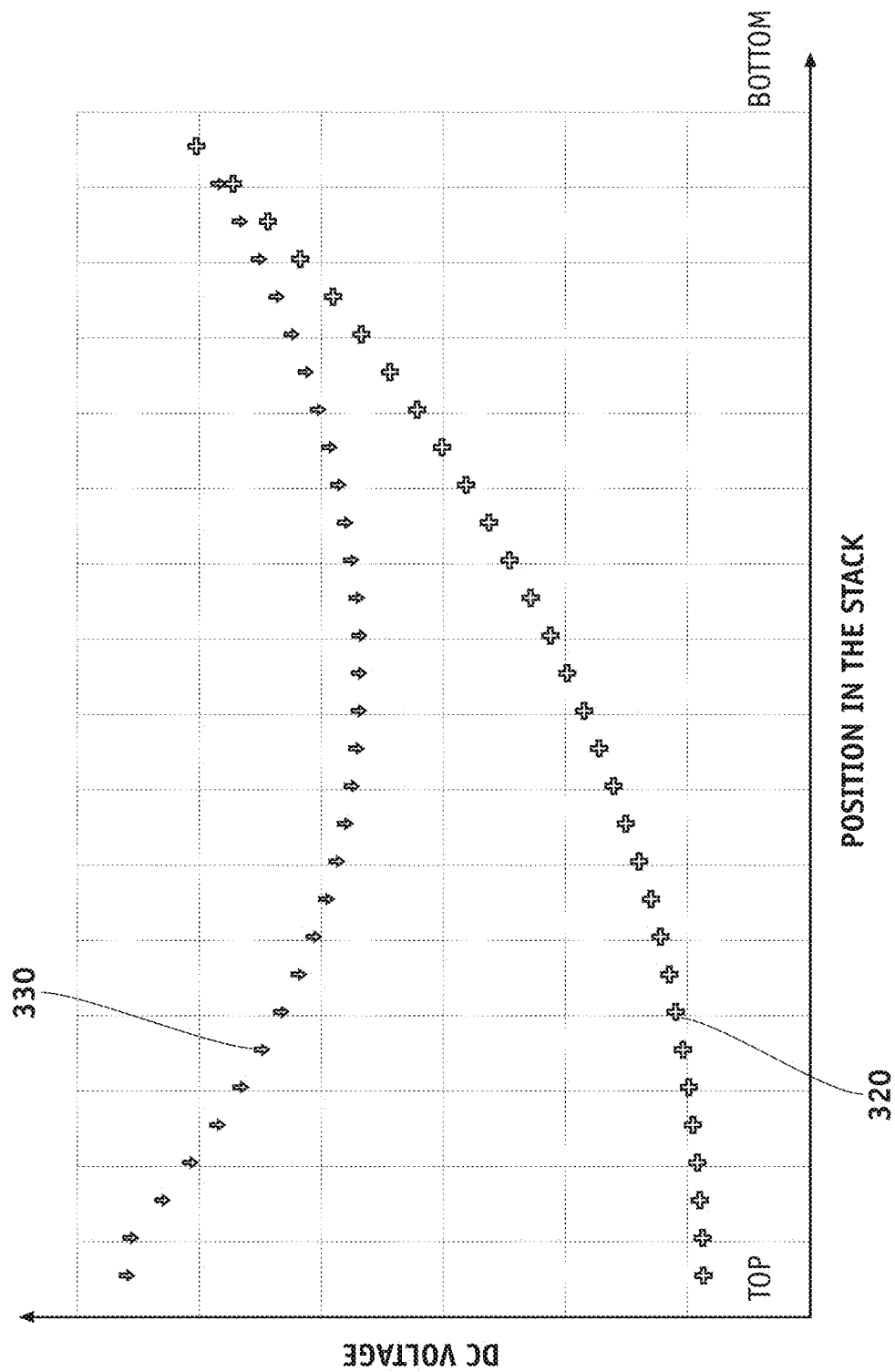

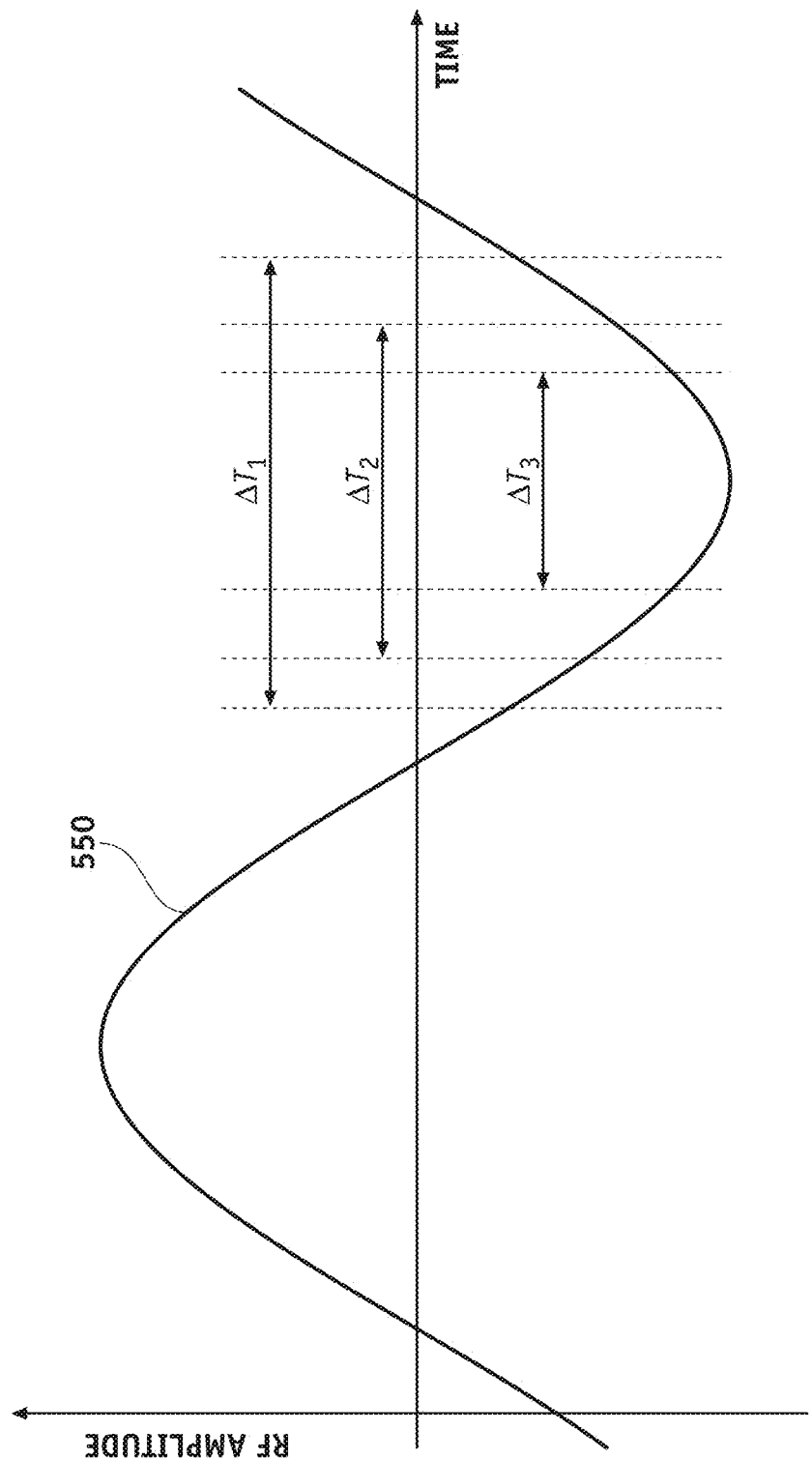

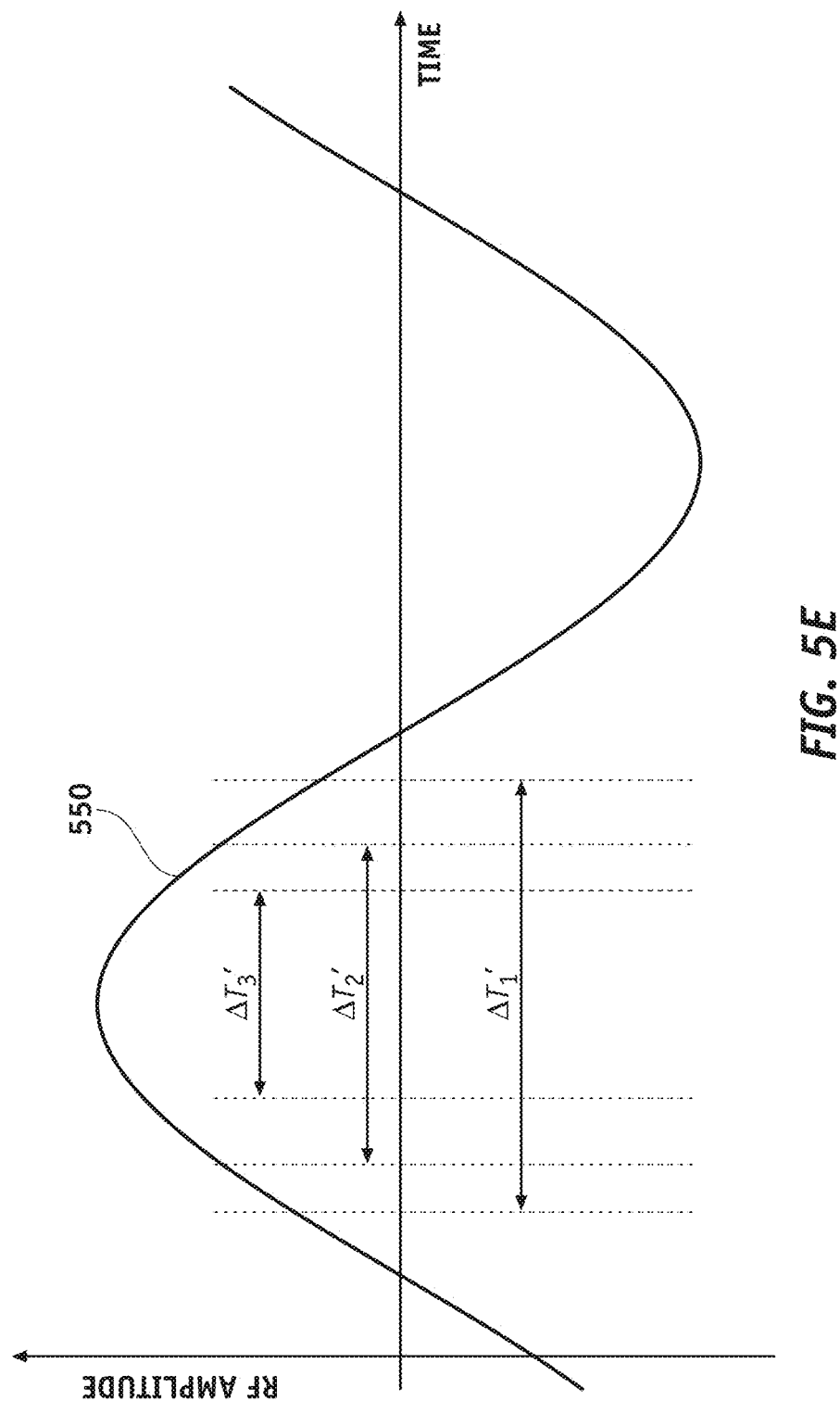

SWITCH FET BODY CURRENT MANAGEMENT DEVICES AND METHODS

CROSS-REFERENCE TO RELATED APPLICATIONS

The present application claims priority to and is a continuation-in-part of U.S. patent application Ser. No. 16/945,283, filed Jul. 31, 2020, entitled "Methods And Devices To Generate Gate Induced Drain Leakage Current Sink Or Source Path For Switch FETs", which is incorporated herein by reference in its entirety.

BACKGROUND

(1) Technical Field

The present disclosure is related to switch FETS, more in particular to switch FETs using body current management methods and devices with discharge paths and/or switch FETs implementing reduced negative body bias voltages for body current management.

(2) Background

When designing communication systems, RF switches are generally implemented in stacked configuration due to the large RF power handling requirement of such switch stacks. FIG. 1A shows a prior art field effect transistor (FET) switch stack (100) including a series arrangement of transistors ($T_1, \ldots, T_n$). The FET switch stack (100) is biased using a body resistor ladder including body resistors ($R_{B1}, \ldots, R_{Bn+1}$), a drain-source resistor ladder including drain-source resistors ($R_{DS1}, \ldots, R_{DSN}$) and a gate resistor structure on the gate side of the transistors as shown. Switch stack (100) is biased using bias voltages (VB, VG) generated by a bias generator circuit (not shown).

In practical conditions, more in particular in stacked switches experiencing large RF swings during the OFF state, each transistor within the stack will generate an undesired gate-induced drain/body leakage current (GIDL) which increases as the peak of the RF swing increases. The GIDL current flows through the body resistor ladder in the direction of arrow (110) as shown in FIG. 1A. As a result of the flow of the unwanted GIDL current, the DC voltage distribution across the body resistor ladder is modified. In other words, various switch stack nodes within the body resistor ladder will experience undesired DC bias voltages different from what the biasing circuit would have provided to such nodes in the absence of such leakage current. Throughout the disclosure, the undesired effect of GIDL current on the DC bias voltage distribution throughout the stack is referred to as the "de-biasing" effect.

The de-biasing effect is further illustrated by the curve (102) of FIG. 1B, representing exemplary DC average voltage profiles for bodies of the transistors of switch stack (100) of FIG. 1A, plotted with reference to the position of the transistors in the stack. The DC voltages at the body terminals of the FETs decrease from the top to the bottom of the stack. In other words, the voltage at the body terminal of transistor ($T_n$) is the most positive and that of transistor ($T_1$) is the most negative, due to the unbalanced voltage distribution resulting from the undesired GIDL current.

The body de-biasing as described above results in early breakdown of the transistors within the FET switch stacks, especially for transistors disposed closer to the top of the stacks. Additionally, the GIDL current needs to be sunk by the biasing circuits providing bias voltages to the switch stack. The higher the GIDL current, the more complex the design of a bias generator due to requirements of higher current strength capability. This may require more design area to accommodate the bias generator. Moreover, the DC current consumption of the bias circuit will also be increased.

With reference to FIG. 1A, in operative conditions when the RF switch is in OFF state, application of a more negative biasing voltage (VB), will result in an improved linearity performance. However, a more negative biasing voltage (VB) will require a more complex biasing circuit occupying a larger area on the chip. The DC current consumption will also be increased.

Therefore, there is a need for methods and devices to reduce the undesired impacts of the GIDL current while maintaining a simpler, less expensive and more compact biasing circuit without comprising power handling capability and the linearity performance of RF switch stacks while operating in OFF state. There is also a need for methods and devices that help maintaining a proper voltage distribution across the stack to prevent early possible voltage breakdown.

SUMMARY

The disclosed methods and devices address the above-mentioned problems and provide solutions to the described challenges.

According to a first aspect of the present disclosure, a field effect transistor (FET) switch stack is provided, comprising: serially connected FETs coupled at one end to a first terminal and at another end to a second terminal, the first terminal being configured to receive a radio frequency (RF) signal; a body resistor ladder coupled to the first terminal, the body resistor ladder comprising a plurality of body resistor elements connected in series, each body resistor element coupled across body terminals of corresponding adjacent FETs of the serially connected FETs; and a first diode element arrangement comprising: i) a diode element stack comprising two or more diode elements, the diode element stack coupled between the body resistor ladder and the first terminal, and ii) one or more additional diode elements, coupled to the body resistor ladder.

According to a second aspect of the present disclosure, a method of controlling a gate induced drain leakage current in an OFF state of a radiofrequency (RF) switch stack, the RF switch stack including i) serially connected FETs configured to receive an RF signal and ii) a body resistor ladder coupled to body terminals of the serially connected FETs is disclosed, the method comprising: applying the RF signal to the RF switch stack; generating a first current discharge path for the gate induced drain leakage current through the body resistor ladder during a first time interval in the OFF state of the RF switch stack; and generating a second current discharge path for the gate induced drain leakage current through the body resistor ladder during a second time interval in the OFF state of the RF switch stack, wherein the second time interval partially overlaps in time with the first time interval during a first overlap time interval in the OFF state of the RF switch where both the first current discharge path and the second current discharge path are generated.

The details of one or more embodiments of the invention are set forth in the accompanying drawings and the descrip-

DESCRIPTION OF THE DRAWINGS

FIG. 2B shows simulation results illustrating exemplary RF signal waveforms according to an embodiment of the present disclosure.

FIG. 3B shows the variation of the DC voltage of the nodes within the drain-source resistor ladder vs. the position of such nodes within an exemplary FET switch stack according to an embodiment of the present disclosure.

FIG. 5C shows an exemplary graph according to an embodiment of the present disclosure.

FIG. 5E shows an exemplary graph according to an embodiment of the present disclosure.

Like reference numbers and designations in the various drawings indicate like elements.

DETAILED DESCRIPTION

Figure 2A:
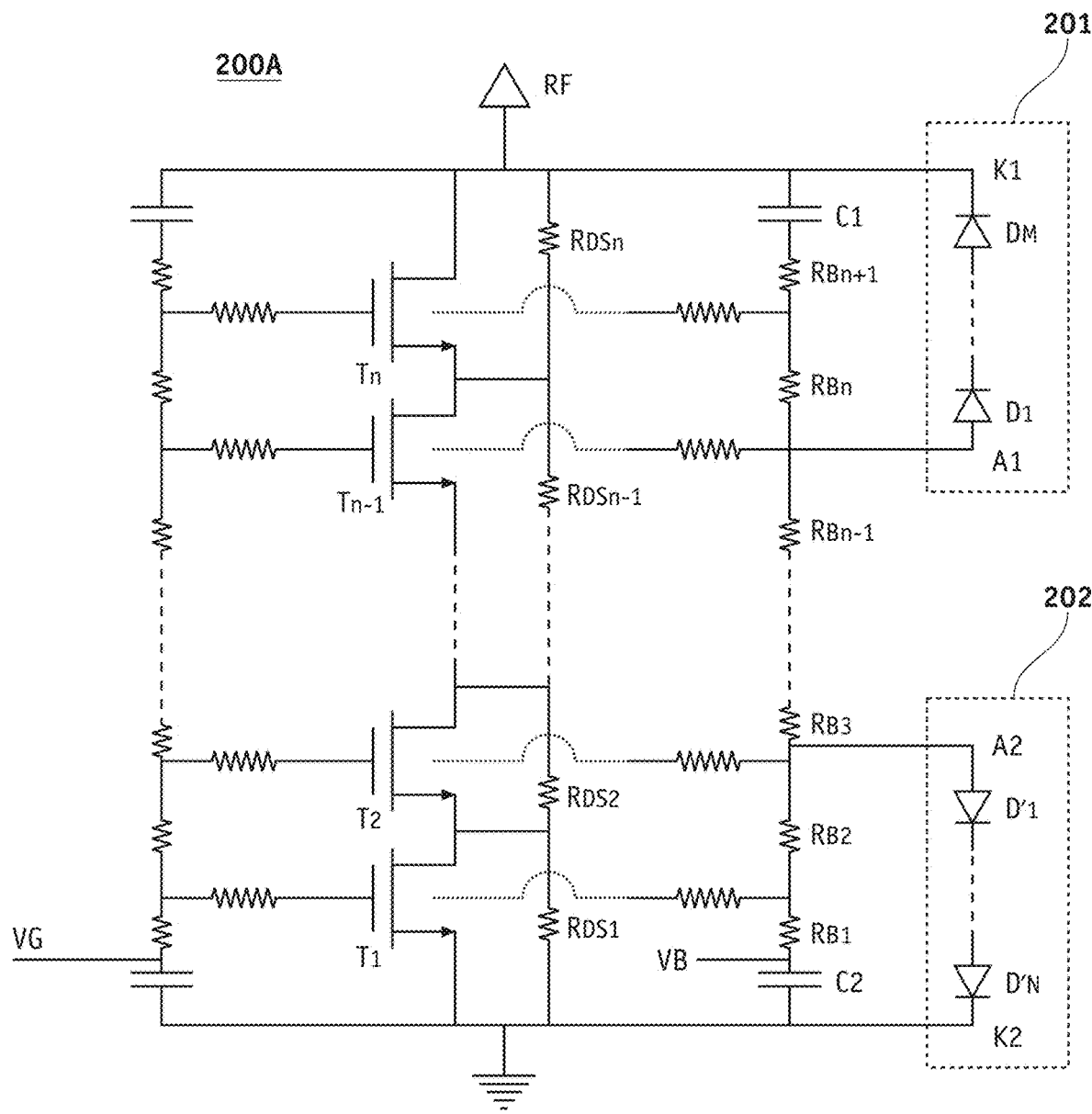
FIG. 2A shows an exemplary FET switch stack according to an embodiment of the present disclosure.

FIG. 2A shows an exemplary FET switch stack (200A), in particular a stack of at least four switches, according to an embodiment of the present disclosure. FET switch stack (200A) is coupled to RF port (RF) at one end and to a reference voltage (e.g. ground) at another end. During operative conditions, an RF signal is delivered to RF switch stack (200A) via RF port (RF). FET switch stack (200A) comprises a series arrangement of transistors ($T_1, \ldots, T_N$). This FET switch stack may be biased using a body resistor ladder including body resistors ($R_{B1}, \ldots, R_{Bn+1}$), a drain-source resistor ladder including drain-source resistors ($R_{DS1}, \ldots, R_{DSn}$) and a gate resistor structure on the gate side of the transistors. Also shown in FIG. 2A are bias voltages (VB, VG) used to bias FET switch stack (200A). Bias voltages (VB, VG) may be generated by of a bias voltage generator circuit (not shown for the sake of simplicity). In operative conditions, when FET switch stack (200A) is in OFF state, bias voltages (VB, VG) may be negative bias voltages.

With continued reference to FIG. 2A, FET switch stack (200A) comprises diode stacks (201) and (202), each coupled across one or more resistors of the body resistor ladder. According to embodiments of the present disclosure, diode stack (201) consists of one or more diodes ($D_1, \ldots D_M$) connected in series, having terminals (A1, K1) through which diode stack (201) is connected to the body resistor ladder. Furthermore, diode stack (202) consists of one or more diodes ($D'_1, \ldots, D'_N$) connected in series, having terminals (A2, K2) through which diode stack (202) is connected to the body resistor ladder. Through the present disclosure, the term diode will be used to mean not only diodes as such but also diode-connected transistors. The lowest number of diodes in series may be used in diode stack (201) as long as when maximum positive voltage RF signal is applied to FET switch stack (200A) and diode stack (201) is in OFF state, voltage across each diode's nodes in diode stack (201) is within diode's voltage reliability limit. The lowest number of diodes in series may be used in diode stack (202) as long as when maximum negative voltage RF signal is applied to FET switch stack (200A) and diode stack (202) is in OFF state, voltage across each diode's nodes in diode stack (202) is within diode's voltage reliability limit.

Other embodiments in accordance with the teachings of the present disclosure and comprising only one out of the two diode stacks (201) or (202) may also be envisaged, wherein the only one existing diode stack may have one or more diodes. In a preferred embodiment, terminal (K1) is connected to RF port (RF), terminal (A1) is connected to a node within the body resistor ladder, terminal (A2) is connected to a node within the body resistor ladder, and terminal (K2) is connected to the reference voltage (e.g. ground). Also any of resistors ($R_{B1}, \ldots, R_{Bn+1}$) may be split into two or more resistors. Terminal (A1) or (A2) may be connected to a node between those split resistors. As also shown in FIG. 2A, diode stacks (201, 202) may be connected with opposite polarities across the body resistor ladder. For example, as will be described in more detail later, in operative conditions, diode stack (202) conducts current in a top-to-bottom direction, while diode stack (201) conducts current in a bottom-to-top direction. As also noted above, any of the diodes within diode stacks (201) or (202) may be implemented using diode-connected transistors.

As mentioned previously, the undesired GIDL current in switch stacks generates a de-biasing issue resulting in possible early breakdown of transistors within the stack, especially for those closer to the RF port. Moreover, the GIDL current needs to be also sinked, i.e. discharged out of the stack. With further reference to FIG. 2A, diode stack (201) addresses the de-biasing issue by sinking the GIDL current to RF port, while diode stack (202) addresses the debiasing issue by sinking the GIDL current to ground.

With continued reference to FIG. 2A, FET switch stack (200A) receives an RF signal through RF port (RF). When the FET switch stack (200A) is in OFF state and during the negative swing of the RF signal, diode stack (201) turns ON, thus generating a discharge path for the GIDL current through RF port (RF). On the other hand, during the positive swing, diode stack (202) turns ON to generate a discharge path for the GIDL current through ground. The person skilled in the art will appreciate that the in-tandem use of both diode stacks (201, 202) provides also more symmetry to the structure of FET switch stack (200A), thus improving the non-linear distortion performance (e.g. reducing harmonics) of the switch stack. It is also understood that such symmetry is an optional feature and not a requirement.

In the following paragraphs:
- $V_{RF+}$ and $V_{RF-}$ represent the peak positive and the peak negative applied RF voltages respectively,
- $R_{B1}=R_{Bn+1}=R/2$ and $R_{B2}=R_{B3}=\ldots=R_{Bn}=R$,
- $V_{RB+}$ and $V_{RB-}$ represent the peak positive and the peak negative RF voltage drop across R body resistor of the body resistor ladder respectively,
- m and k represent the number of diodes in diode stacks (201, 202) respectively, where m and k may be the same or different, and
- Vth represents the threshold voltage of the diodes within diode stacks (201) or (202).

By way of example, and not of limitation, if an RF voltage with a peak of 100V is applied to a switch stack with 25 transistors, then $V_{RB+}=100/25=4V$ and $V_{RB-}=-100/25=-4V$.

Referring back to FIG. 2A and using the above-mentioned definitions, during the negative swing of the applied RF voltage, diode stack (201) begins conducting, and therefore discharging the GIDL current, when $(X*V_{RB-})-VB<m*Vth$. Parameter X is a ratio defined based on the resistances of the body resistors across which diode stack (201) is coupled. To further clarify and as an example, for the embodiment shown in FIG. 2A, parameter X is defined as $X=(R_{Bn}+R_{Bn+1})/R_{Bn}=(R+R/2)/R=3/2$. During the positive swing of the applied RF voltage, diode stack (202) begins to conduct when $(Y*V_{RB+})+VB>k*Vth$, where Y is defined similarly to the case above as $Y=(R_{B1}+R_{B2})/R_{B2}=(R/2+R)/R=3/2$ for diode stack (202). During the positive swing of the applied RF signal, diode stack (201) is in OFF state, and peak voltage, Vr1, across each diode within the diode stack (201) can be obtained as $Vr1=((X*V_{RB+})-VB)/m$. On the other hand, during the negative swing of the applied RF voltage, diode stack (202) is in OFF state, and the peak voltage, Vr2, across each diode within diode stack (202) can be obtained as $Vr2=(-Y*V_{RB-})-VB)/k$. According to embodiments of the present disclosure, Vr1 and Vr2 are less than the peak voltage reliability limit of the reverse-biased-diodes within diode stacks (201, 202).

FIG. 2B shows some simulation results illustrating the RF current running from RF port to ground through the body resistor ladder as a function of time. Curve (210) represents the case before implementing the teachings of the disclosure (i.e. without diode stacks). As can be seen, curve (210) is asymmetric with respect to the time axis (i.e. amplitudes a1 and a2 are not equal). On the other hand, curve (220) represents the case after the implementation of the diode stacks. As can be noticed, as a result of implementing the diode stacks, the RF current has become more symmetric in terms of positive peak vs negative peak behavior. Finally, curve (230) shows the difference between curves (210, 220) to highlight the positive impact of implementing diode stacks to mitigate the negative impact of the undesired GIDL current.

Figure 2C:
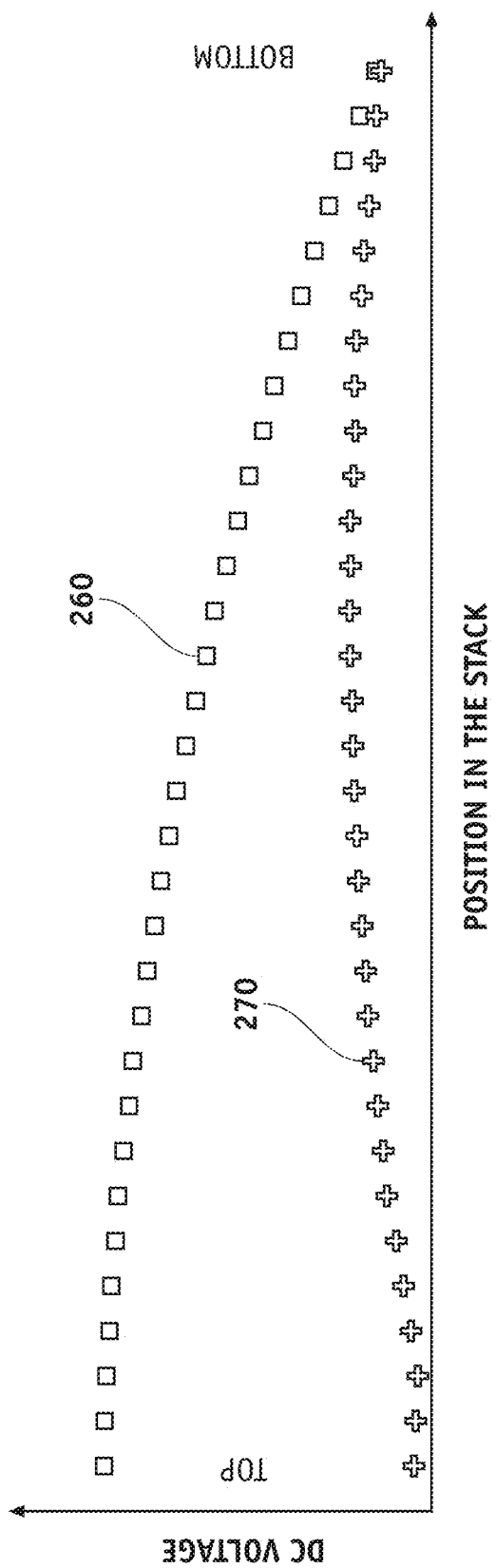
FIG. 2C shows exemplary variations of the DC voltage of the node within the body resistor ladder of a switch stack according to an embodiment of the present disclosure.

FIG. 2C shows the variation of the DC voltage of the nodes within the body resistor ladder vs. the position of such nodes within the stack. Curves (260, 270) represent such variations without and with implementation of the teachings of the present disclosure (i.e. implementing diode stacks (201, 202) of FIG. 2A) respectively. As mentioned previously, without implementation of the teachings of the disclosure, the DC voltage for each element from top to bottom drops according to a decreasing function of its position within the stack. On the other hand, with the implementation of the diode stacks, the positional element-by-element variation of the DC voltage is significantly less: the curve is more flat and the voltage distribution is more even.

Figure 3A:
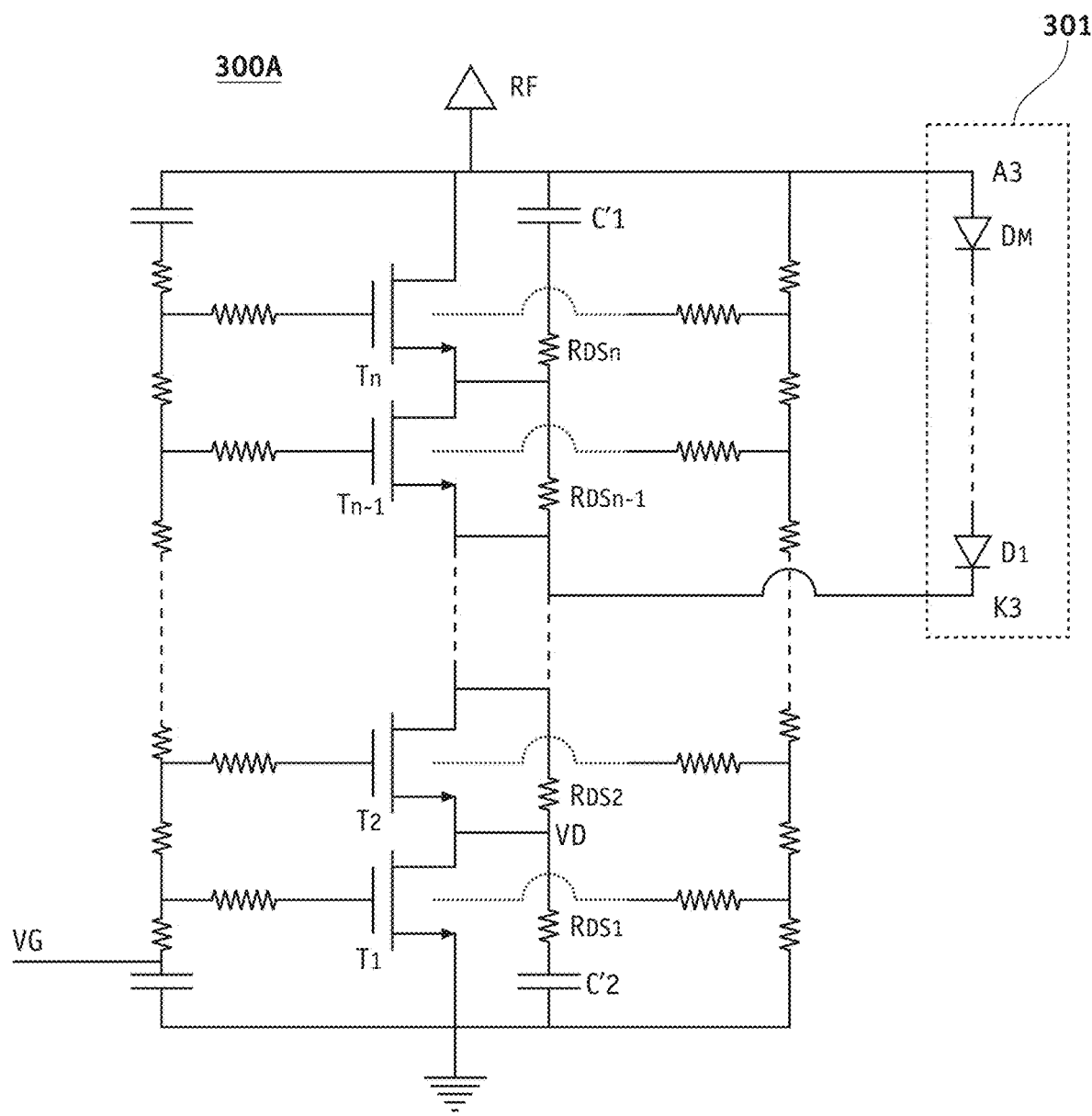
FIG. 3A shows an exemplary FET switch stack according to an embodiment of the present disclosure.

FIG. 3A shows an exemplary FET switch stack (300A), in particular a stack of at least four switches, according to a further embodiment of the present disclosure. Although there are similarities between the structure of FET switch stack (300A) and that of FET switch stack (200A) of FIG. 2A, the biasing scheme of FET switch stack (300A) is different in the sense that FET switch stack (300A) operates in positive logic. In other words, in a preferred embodiment, during operation and when FET switch stack (300A) is in OFF state, bias voltage (VG) is at 0 V and bias voltage (VD) applied to the drain-source resistor ladder is a positive bias voltage. Moreover, in the embodiment of FIG. 3A, capacitors (C1, C2) previously disposed in the body resistor ladder of FIG. 2A are now designated with ($C'_1$, $C'_2$) and disposed in the drain-source resistor ladder. Similarly to what described with regards to the embodiment of FIG. 2A, the GIDL current has the same negative effect of de-biasing FET switch stack (300A), except that the direction of current in the drain-source resistor ladder is different and is from bottom to top. The reason for such difference is that in switch stack FETs when in OFF state, the GIDL current flows into the drain terminals and out of the body terminals of the FETs. In other words, proceeding from drain-source resistor ($R_{DS1}$) to drain-source resistor ($R_{DSn}$), the average DC voltages at various nodes of the drain-source resistor ladder decrease. Also shown in FIG. 3A, is diode stack (301) which, differently from diode stack (201), is connected across one or more drain-source resistors of the drain-source resistor ladder diode stack (301) consists of a series connection of diodes ($D_1, \ldots D_M$) and has terminals (A3, K3). In a preferred embodiment, anode terminal (A3) is connected to RF port (RF) and cathode terminal (K3) is connected to a node other than ground within the drain-source resistor ladder.

With further reference to FIGS. 2A and 3A, the functionality of diode stack (301) is similar to what was previously described in regards to diode stack (201) except that such diode stacks are implemented with opposite polarities due to the fact the drain is biased at positive voltage and the current flowing in the drain-source ladder and the current flowing in the body resistor ladder have opposite directions. In operative conditions, when FET switch stack (300A) is in OFF state, during the positive swing of the applied RF signal, diode stack (301) is in ON state (conducting), thereby generating a source path through RF port (RF) for the undesired GIDL current running through drain-source resistor ladder. During the negative swing of the applied RF signal, diode stack (301) is in OFF state (non-conducting).

FIG. 3B shows the variation of the DC voltage of the nodes within the drain-source resistor ladder of FIG. 3A vs. the position of such nodes within the stack. Curves (320, 330) represent such variations without and with implementation of the teachings of the present disclosure (i.e. implementing a diode stack (301) of FIG. 3A) respectively. As mentioned previously, without implementation of a diode stack as described before, the DC voltage is an increasing function of the position within the stack. As also shown, with the implementation of the diode stack, the positional element-by-element variation of the DC voltage is significantly less: the curve is more flat and the voltage distribution is more even.

Figure 3C:
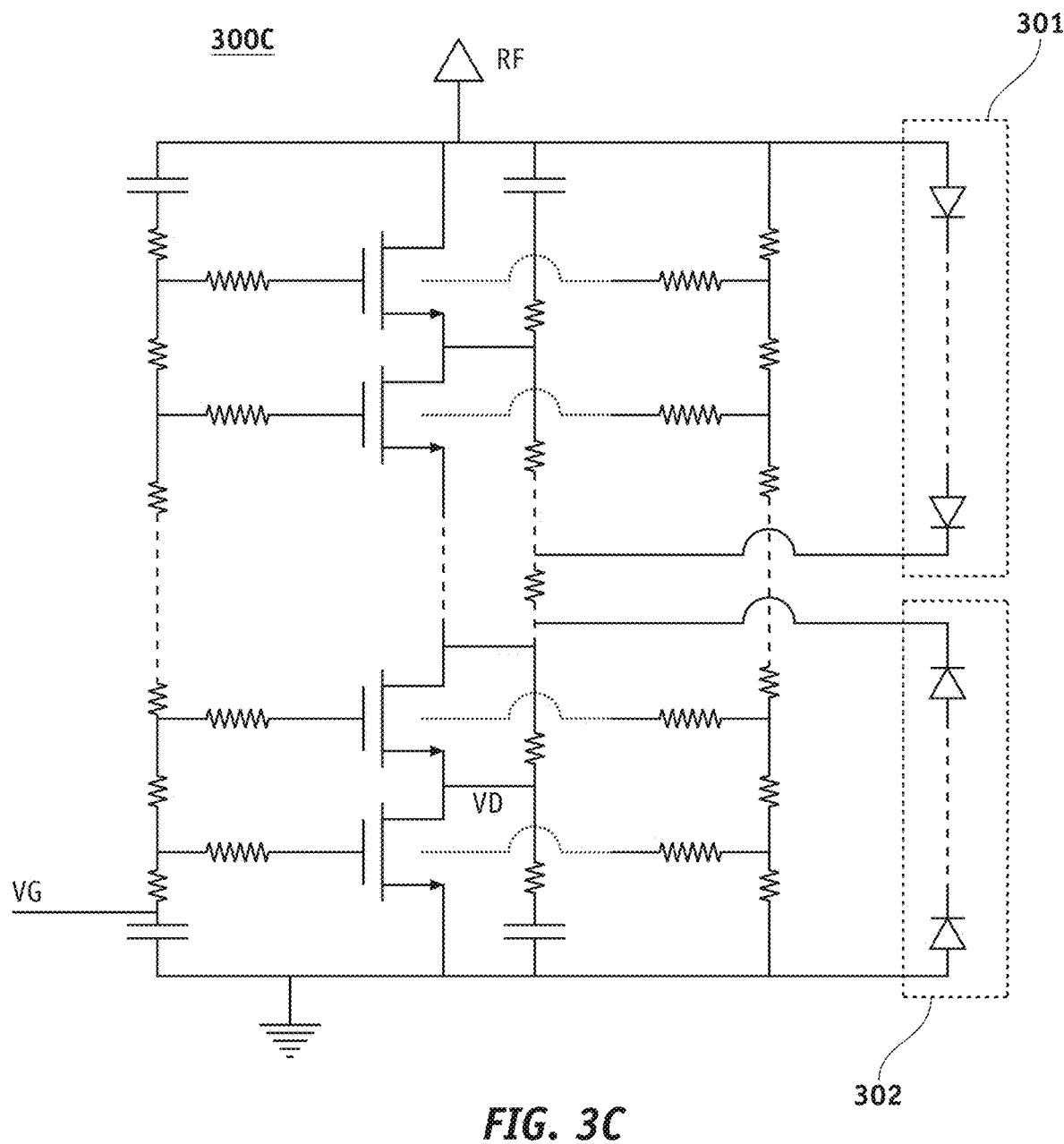
FIG. 3C shows an exemplary FET switch stack according to an embodiment of the present disclosure.

FIG. 3C shows an exemplary FET switch stack (300C), in particular a stack of at least four switches, according to a further embodiment of the present disclosure. FET switch stack (300C) functions in positive logic and the principle of its operation is similar to what was described with regards to FET switch stack (300A), except that FET switch stack (300C) further comprises diode stack (302) that is used to work in tandem with diode stack (301) to further overcome the negative impacts of the GIDL current. In operative conditions, and when FET switch stack (300C) is in OFF state, during the negative swing of the applied RF signal, diode stack (302) turns ON and provides a source path, through ground, for the undesired GIDL current. Diode stack (302) is in OFF state during the positive swing of the applied RF signal. Similarly to what was described before, the addition of stack (302) provides more symmetry to the structure, thus a better overall non-linear distortion performance.

Figure 4A:
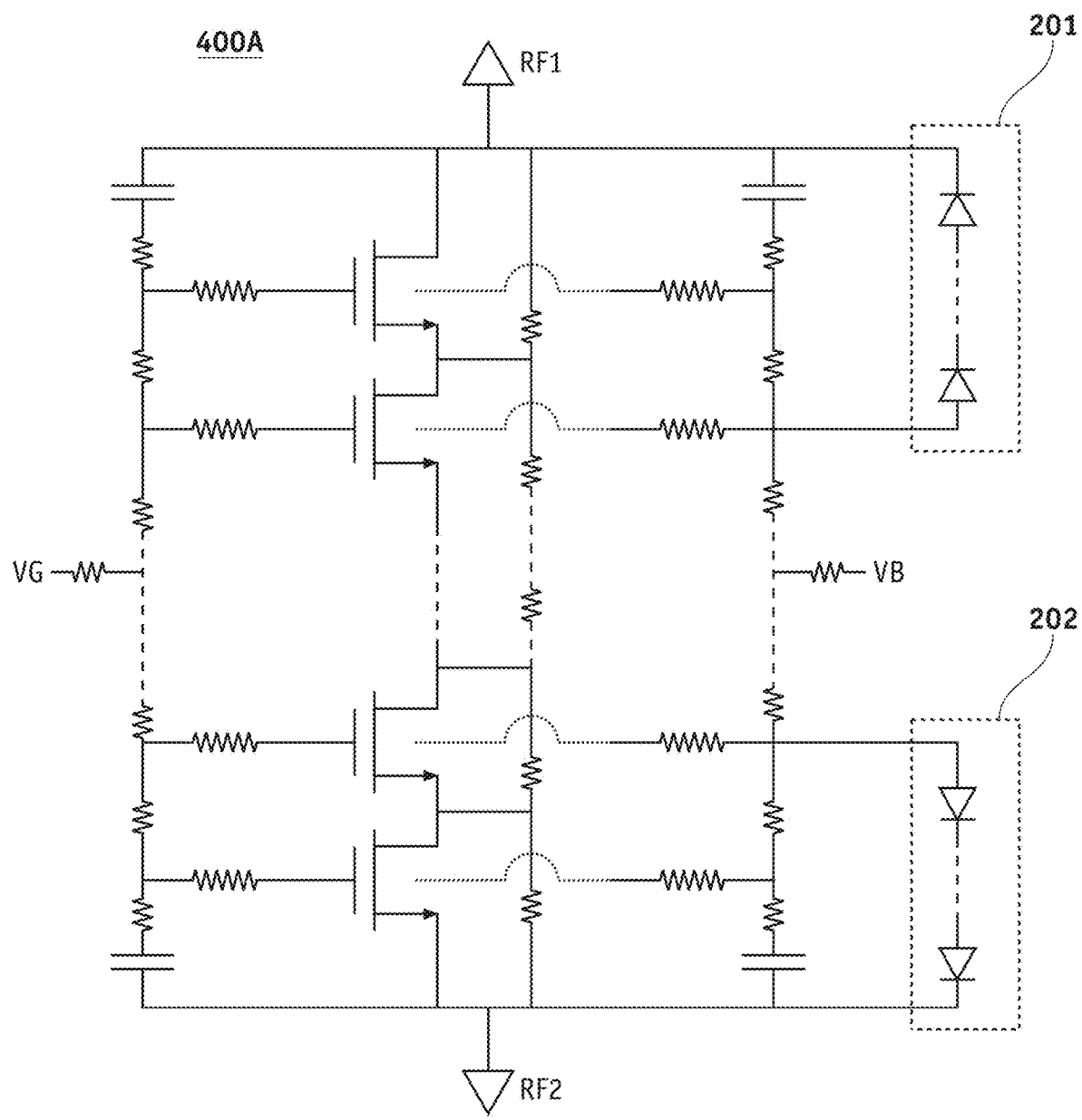
FIGS. 4A-4B show exemplary FET switch stacks implemented in series configurations according to an embodiment of the present disclosure

In the embodiments shown in FIGS. 2A, 3A, 3C, the FET switch stacks are implemented according to a shunt configuration, i.e. between an RF terminal and a reference or ground terminal. However, the teachings of the present disclosure are equally applicable in the scenarios where the FET switch stack is implemented based on a series configuration, i.e. between two RF terminals. FIG. 4A shows a FET switch stack (400A), in particular a stack of at least four switches, in accordance with embodiments of the present disclosure. FET switch stack (400A) is essentially the same as FET switch stack (200A) of FIG. 2A but implemented in a series configuration. The RF signal is input from RF port (RF1) and output from RF port (RF2). Given the series configuration of FET switch stack (400A) and for the sake of better symmetry, bias voltages (VG, VB) are applied in the middle of the respective gate and body ladders rather than at the bottom of such ladders as in the FET switch stack (200A) of FIG. 2A. In a preferred embodiment, during operation and when FET switch stack (400A) is in OFF state, bias voltages (VG, VB) may be negative bias voltages.

Figure 4B:
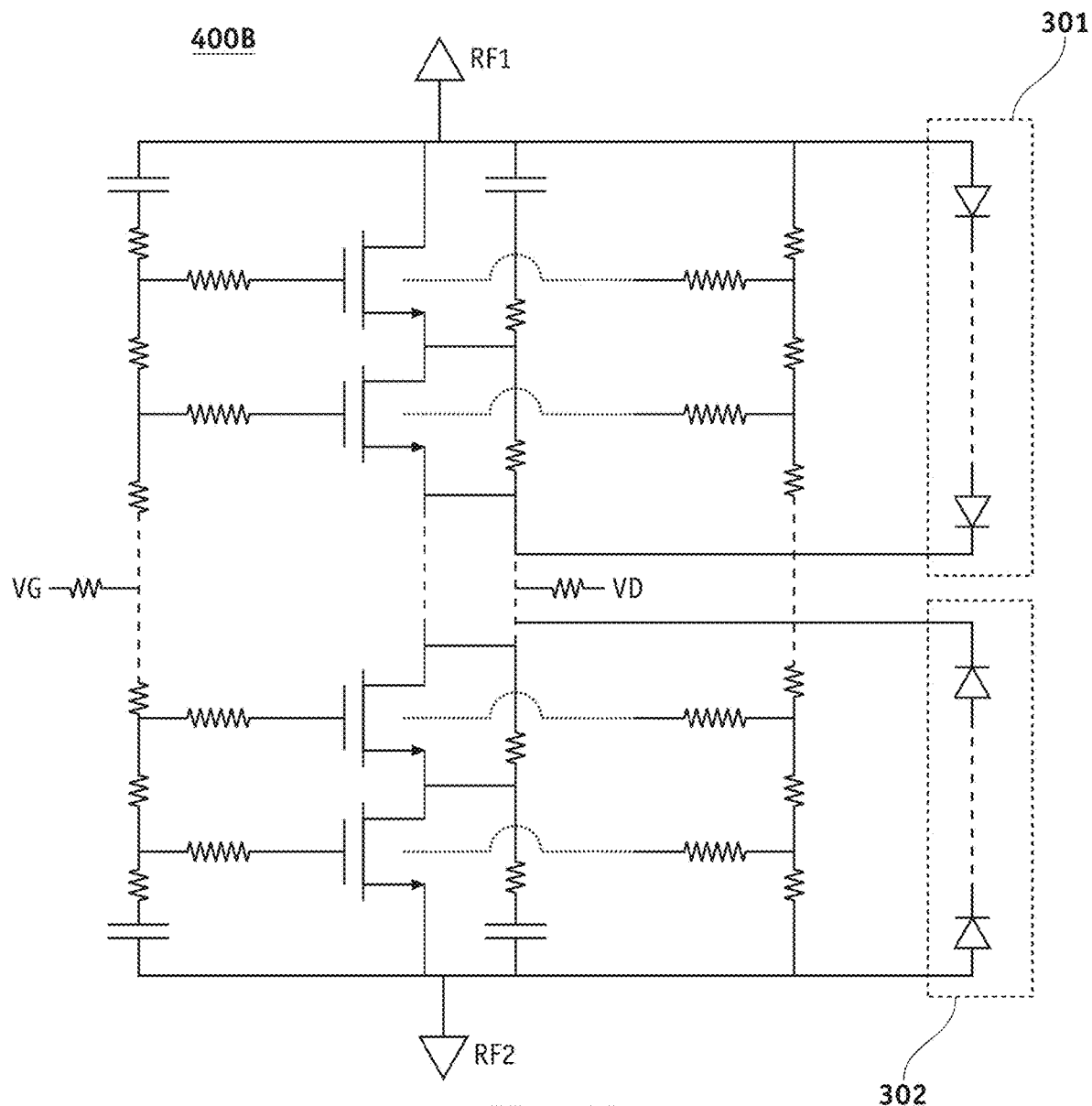

FIG. 4B shows a FET switch stack (400B), in particular a stack of at least four switches, in accordance with embodiments of the present disclosure. FET switch stack (400B) is essentially the same as FET switch stack (300C) of FIG. 3C but implemented in a RF1-RF2 series configuration. The RF signal is input from RF port (RF1) and output from RF port (RF2). Given the series configuration of FET switch stack (400B) and for the sake of better symmetry, bias voltages (VG, VD) are applied in the middle of the respective gate and drain-source ladders rather than at the bottom of such ladders as in the FET switch stack (300C) of FIG. 3C. In a preferred embodiment, during operation and when FET switch stack (400B) is in OFF state, bias voltage (VG) is about 0V and bias voltage (VD) may be a positive bias voltage.

Figure 5A:
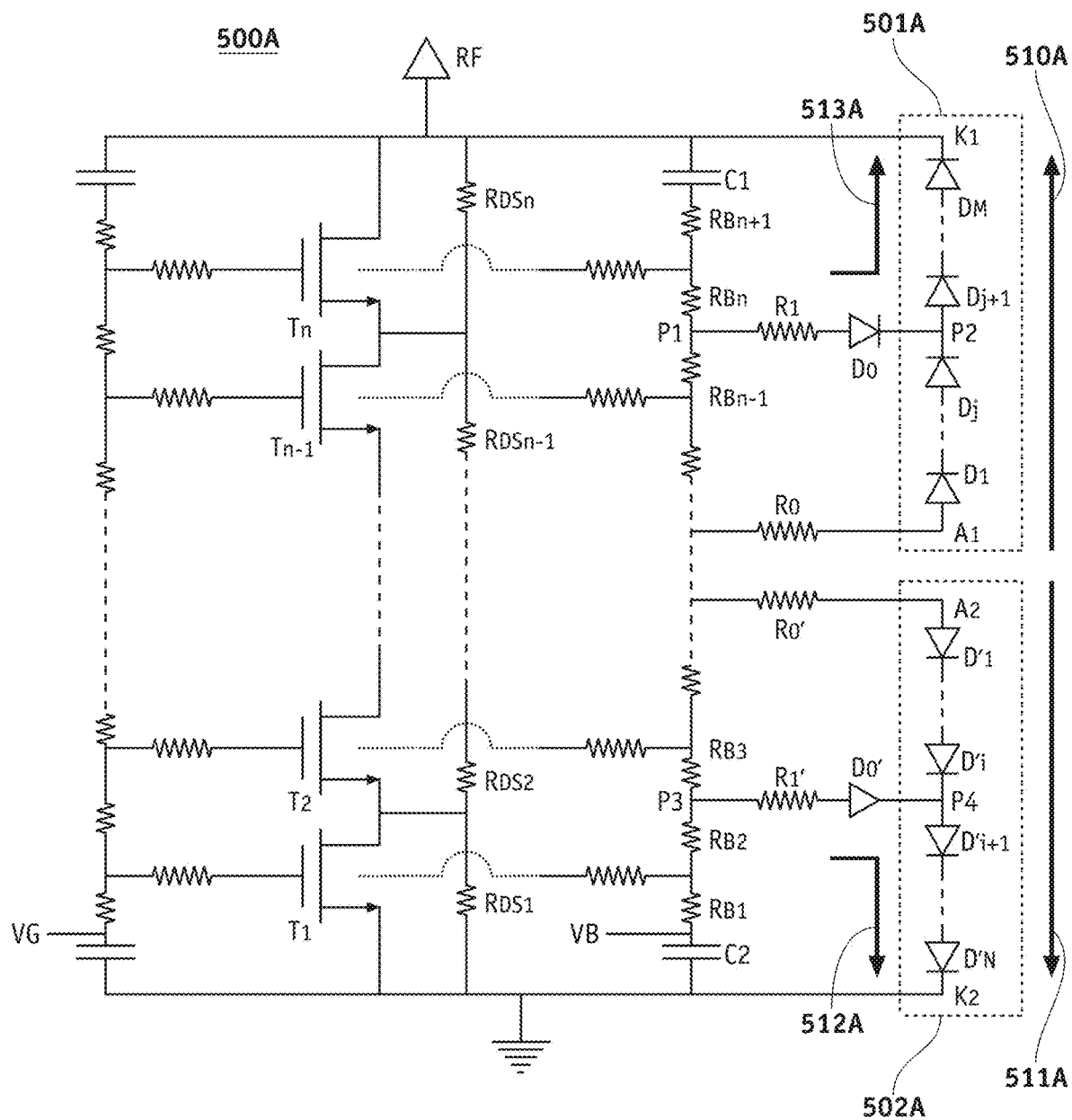
FIG. 5A shows an exemplary FET switch stack according to an embodiment of the present disclosure.

FIG. 5A shows an exemplary FET switch stack (500A) according to a further embodiment of the present disclosure. The structure and functionality of switch stack (500A) of FIG. 5A is similar to what was described with regards to switch stack (200A) of FIG. 2A except for some additional elements and functionalities that will be described below in detail.

FET switch stack (500A) comprises diode stacks (501A) and (502A), each coupled across one or more resistors of the body resistor ladder. According to embodiments of the present disclosure, diode stack (501A) consists of one or more diodes (D1, . . . DM) connected in series, having terminals (A1, K1) through which diode stack (501A) is coupled to the body resistor ladder. Resistor (R0) connecting diode (D1) to the body resistor ladder is optional, i.e. when resistor (R0) is not used, diode (D1) is directly connected to body resistor ladder. Diode stack (502A) consists of one or more diodes (D'$_1$, . . . , D'$_N$) connected in series, having terminals (A2, K2) through which diode stack (302A) is connected to the body resistor ladder. Resistor (R0') connecting diode (D'k) to the body resistor ladder is optional.

As already noted for the previous embodiments, the term diode will be used to mean not only diodes as such but also diode-connected transistors. With continued reference to FIG. 5A, also in the present embodiment the number of diodes in series to be used in diode stack (501A) can be varied, as long as when a maximum positive voltage RF signal is applied to FET switch stack (500A) and diode stack (501A) is in OFF state, the voltage across each diode's nodes in the diode stack (501A) is within the diode's voltage reliability limit. Similar considerations apply to diode stack (502A).

According to the embodiment shown in FIG. 5A, FET switch stack (500A) further comprises "horizontal" or "rung" diode (D0) arranged in series with optional resistor (R1) and horizontal or rung diode (D0') arranged in series with optional resistor (R1'). The series combination of resistor (R1) and diode (D0) is connected, at one end, to node (P1) of the body resistor ladder, and at another end, to node (P2) of the "vertical" or "rail" diode stack (501A). The series combination of resistors (R1') and diode (D0') is connected, at one end, to node (P3) of the body resistor ladder, and at another end, to node (P4) of the "vertical" or "rail" diode stack (502A).

The presence of the rung diodes (D0, D0') provides discharge paths (513A, 512A) for the GIDL current during the OFF state of the FET switch stack that are additional to the discharge paths (510A, 511A) provided by the stacks (501A, 502A) of rail diodes. As will be described more in detail later, when the FET switch stack is in OFF state, two current discharge paths (510A, 513A) are formed during the negative RF signal swing to convey, at least partially, the undesired GIDL current. Similarly, during the positive RF signal swing, two current discharge paths (511A, 512A) are formed to convey the generated GIDL current during such swing to ground.

According to the teachings of the present disclosure, FET switch stack (500A) of FIG. 5A can be implemented in both shunt (as shown) or series (where the bottom end is coupled to an RF port instead of a reference voltage) configurations Additionally, with continued reference to FIG. 5A, in accordance with the teachings of the present disclosure:
proceeding from top to the bottom of the body resistor ladder, nodes (P1, P3) may be located at any point within the body resistor ladder
node (P2) may be located at any point between the cathode of diode (D1) at the bottom of the diode stack (501A) and the anode of diode (DM) at the top of diode stack (501A)
node (P4) may be located at any point between the anode of diode (D'N) at the bottom of the diode stack (501A) and the cathode of diode (D'1) at the top of diode stack (502A)
any of resistors (RB1, . . . , RBn+1) may be split into two or more series resistors with common points of connection serving as tapping points. Nodes (P1, P$_3$) may also be located at such tapping points. As an example, as shown in FIG. 5A, the series combination of body resistors (RB2, RB3) is coupled across the bodies of transistors (T1, T2). In this example, node (P3) is located between body resistors (RB2, RB3)

as also noted in the next paragraph, further paths that are additional to paths (512A, 513A) can be devised, by introducing rung diodes (and optional related resistors) that are additional to diodes (D0, D0').

With continued reference to FIG. 5A, for the sake of simplicity and for illustration purposes, on the upper portion of the FET switch stack (500A), only one resistor-diode pair (R1, D0) connecting a node on the body resistor ladder, i.e. P1, to corresponding node (P2) within diode stack (501A) is shown. Similarly, only one resistor-diode pair (R1', D0') connecting a node on the body resistor ladder, i.e. P3, to corresponding node (P4) within diode stack (502A) is also shown on the lower portion of FET switch stack (500A). However, other embodiments may also be envisaged where two or more of such rung diodes or rung diode-resistor combinations couple two or more nodes of the body resistor ladder to corresponding nodes of diode stack (501A), and/or two or more of such rung diodes or rung diode-resistor combinations couple two or more nodes of the body resistor ladder to corresponding nodes of diode stack (502A). Additional diodes and/or diode-resistor pairs will result in additional current discharge paths, thereby further reducing the negative impacts of the undesired GIDL current.

Figure 5B:
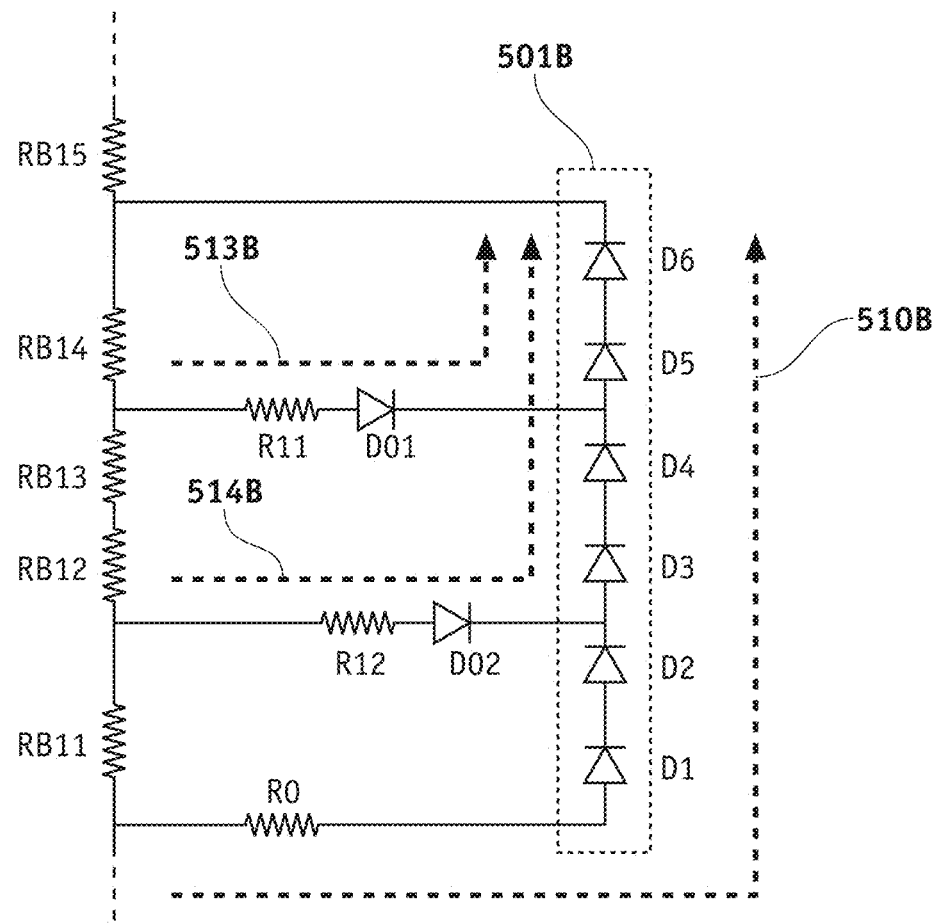
FIG. 5B shows a portion of an exemplary FET switch stack according to an embodiment of the present disclosure.

In order to further clarify the concept disclosed above, reference is made to FIG. 5B showing a portion of an exemplary implementation of FET switch stack (500A) of FIG. 5A. For the sake of simplicity, only a portion of the FET switch stack is shown. Diode stack (501B) is an exemplary implementation of diode stack (501A) of FIG. 5A and comprises diodes (D1, . . . , D6). A portion of the body resistor ladder including body resistors (RB11, . . . , RB15) is also shown. As can be seen in this exemplary embodiment, two resistor-diode pairs (R11, D01), and (R12, D02) couple two respective nodes on the resistor body ladder to corresponding nodes within diode stack (501B).

FIG. 5C shows an exemplary graph according to the teachings of the present disclosure. Curve (550) represents the amplitude of the RF signal received through RF port (RF) of FIG. 5A vs. time, which consists of a positive RF signal swing (left side) and a negative RF signal swing (right side). With reference to FIGS. 5A, 5B, and 5C, when the FET switch stack (500A) is in OFF state and during a first time interval ($\Delta T_1$) of the negative swing of the RF signal, diode stack (501B) turns ON, thus generating a first discharge path for the GIDL current via resistor (R0), in the direction (510B), and through RF port (RF). Moreover, during a second time interval ($\Delta T_2$) diode (D02) may turn on, thus generating a second and additional discharge path for the GIDL via resistor (R12), in the direction (514B), and through RF port (RF). During a third time interval ($\Delta T_3$), diode (D01) may turn on, thus generating a third and discharge path for the GIDL via resistor (R11), in the direction (513B), and through RF port (RF). In a preferred embodiment, and as shown in FIG. 5C, the first discharge path in the direction (510B) is active during time intervals ($\Delta T_1$, $\Delta T_2$, $\Delta T_3$), the second discharge path (514B) is active during the time intervals ($\Delta T_2$, $\Delta T_3$), and the third discharge path (513B) is active during time interval ($\Delta T_3$). In other words, in such preferred embodiment, during the negative swing of the RF voltage, various diodes turn on at different times in the following order: diode stack (501B) will be the first to turn on, then diode (D02) will turn on at a later time, and the last diode to turn on will be diode (D01).

Figure 5D:
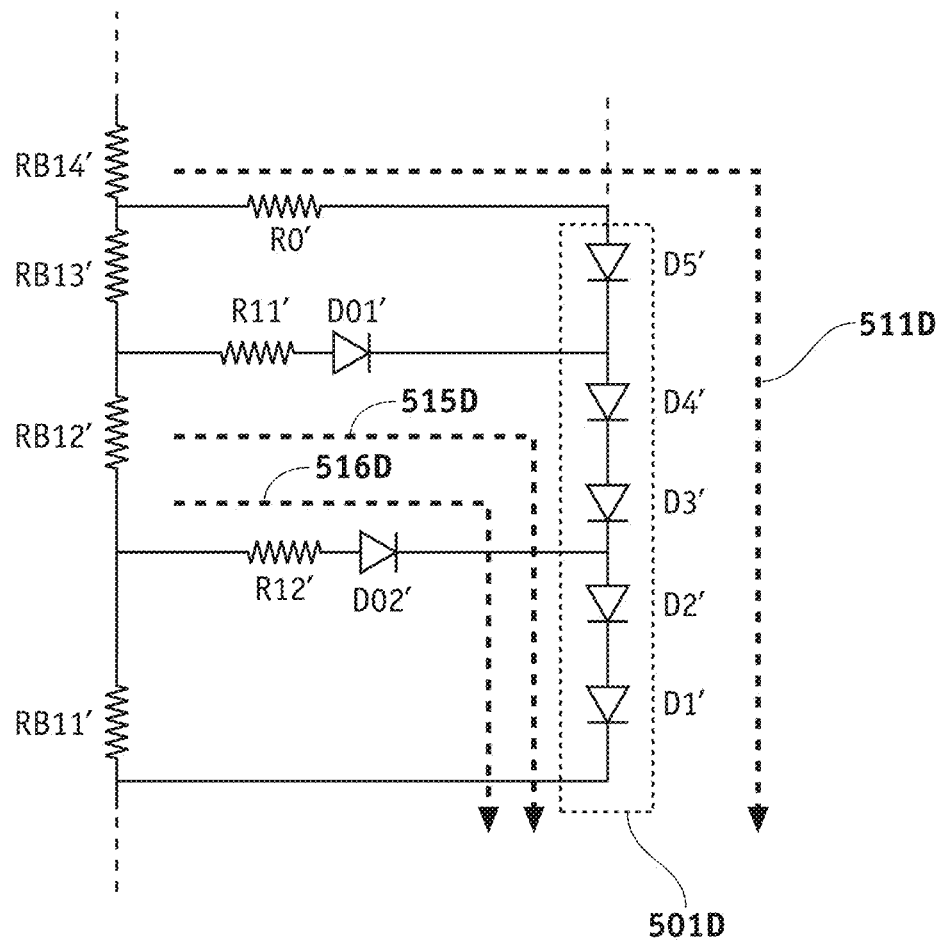
FIG. 5D shows a portion of an exemplary FET switch stack according to an embodiment of the present disclosure.

Similarly to what was previously shown in FIG. 5B, FIG. 5D shows another portion of an exemplary implementation of FET switch stack (500A) of FIG. 5A. For the sake of simplicity, only a portion of the FET switch stack is shown. Diode stack (501D), an exemplary implementation of diode stack (501A) of FIG. 5A, comprises diodes (D1', . . . , D5'). A portion of the body resistor ladder including body resistors (RB11', . . . , RB14') is also shown. As can be seen in this exemplary embodiment, two resistor-diode pairs (R11', D01'), and (R12', D02') couple two respective nodes on the resistor body ladder to corresponding nodes within diode stack (501D).

Similarly to what was previously shown in FIG. 5C, FIG. 5E shows an exemplary graph according to the teachings of the present disclosure. Curve (550) represents the RF signal amplitude received through RF port (RF) of FIG. 5A vs. time. With reference to FIGS. 5A, 5D, and 5E, when the FET switch stack (500A) is in OFF state and during a first time interval ($\Delta T_1'$) of the positive swing of the RF signal, diode stack (501D) turns ON, thus generating a first discharge path for the GIDL current via resistor (R0'), in the direction (511D), and through ground. Moreover, during a second time interval ($\Delta T_2'$) diode (D01') may turn on, thus generating a second discharge path for the GIDL via resistor (R11'), in the direction (515D), and through ground. During a third time interval ($\Delta T_3'$), diode (D02') may turn on, thus generating a third discharge path for the GIDL via resistor (R12'), in the direction (516D), and through ground. In a preferred embodiment, and as shown in FIG. 5E, the first discharge path in the direction (511D) is active during time intervals ($\Delta T_1'$, $\Delta T_2'$, $\Delta T_3'$), the second discharge path (515D) is active during the time intervals ($\Delta T_2'$, $\Delta T_3'$), and the third discharge path (516D) is active during time interval ($\Delta T_3'$). In other words, in such preferred embodiment, during the positive swing of the RF voltage, various diodes turn on at different times in the following order: diode stack (501D) will be the first to turn on, then diode (D01') will turn on at a later time, and the last diode to turn on will be diode (D02'). In the following exemplary embodiment, the conditions for this order to occur will be explored more in detail.

Figure 5F:
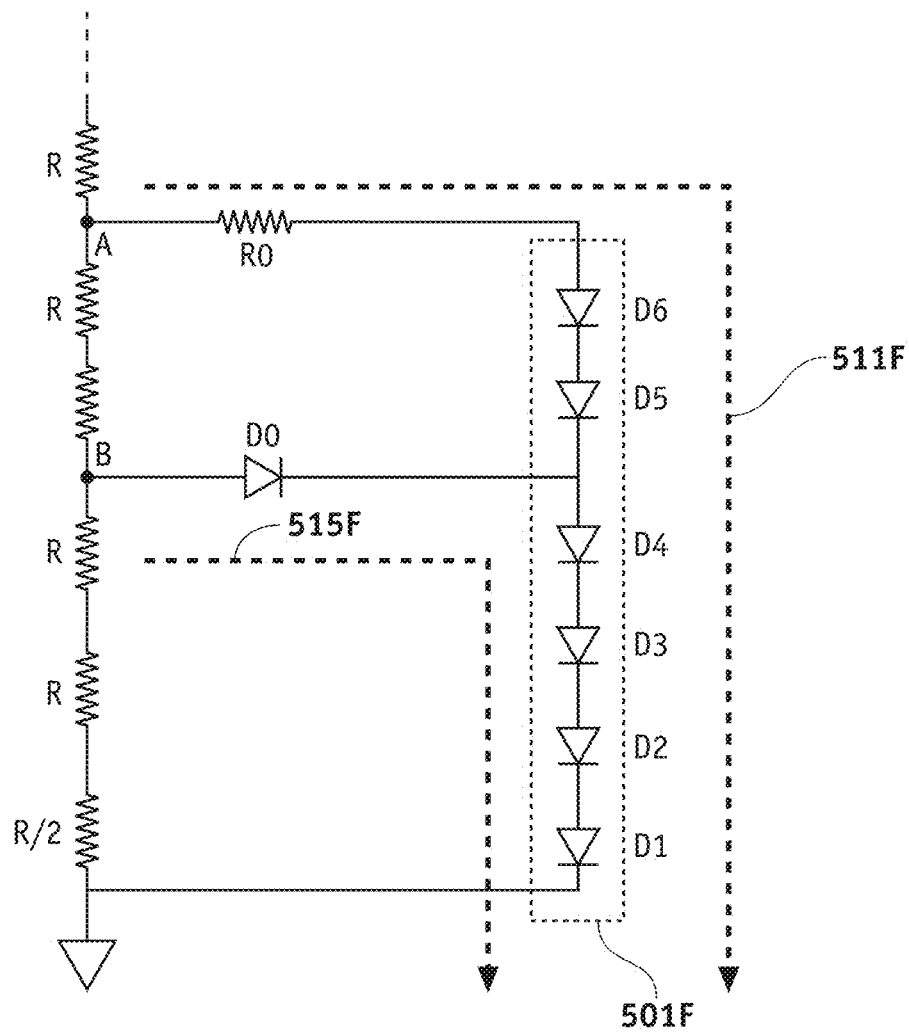
FIG. 5F shows a portion of an exemplary FET switch stack according to an embodiment of the present disclosure.

FIG. 5F shows a portion of an exemplary implementation of FET stack (500A) of FIG. 5A. The minimum RF voltage required at node (A) to turn on diode stack (501F) can be calculated as follows:

$$V_A = 6V_{th}$$

where $V_{th}$ represents the threshold voltage of each of the six diodes (D1, . . . , D6) and where the voltage drop introduced by the presence of (R0) has not been considered for the sake of simplicity. Having RF voltage ($V_A$) at node (A), voltage ($V_B$) at node (B) can then be calculated as:

$$V_B = V_A \frac{2R + R/2}{4R + R/2} = 6V_{th}\frac{5}{9} = 3.336 V_{th}$$

However, the minimum voltage required to activate the discharge path (515F), i.e. to turn on diodes (D0, D1, . . . D4), would be $5V_{th}$, as there are five diodes (one horizontal and four vertical) in such discharge path. Based on the above, the discharge path (511F) will be activated first and before the discharge path (515F), consistently with the representation of FIG. 5C, where the duration of interval $\Delta T_1$ is longer than the duration of interval $\Delta T_2$.

In view of the above-disclosed concept, the person skilled in the art will appreciate that depending on the application, various design parameters such as the voltage division across the body resistor ladder, the number of discharge paths and the number of diodes used in each path may be adjusted to achieve desired conditions (time and RF amplitude during positive and negative swing) for turning plural discharge paths on to counter act the undesired GIDL current. This will provide further design flexibility when facing challenging performance requirements.

As noted in the above paragraphs, each rung diode, and possibly also the top-most and bottom-most diodes of the rail diode stack, can be coupled to the body ladder through a resistor. The presence of such resistors is for current limiting purposes. As shown, for example, in FIGS. 5C and 5E, there will be time intervals during the positive and negative swings of the RF signal where more than one diode path will be conducting, e.g. two diode paths during interval ($\Delta T_2$) and three diode paths during interval ($\Delta T_3$), with a corresponding additional current stress on the rail diode stack. The potential presence of resistors such as (R0, R0'), (R1, R1'), (R11, R12) and so on, serves the purpose of providing tools for the person skilled in the art to limit the total amount of current according specific implementations and design demands of the diode paths of the present disclosure.

Figure 5G:
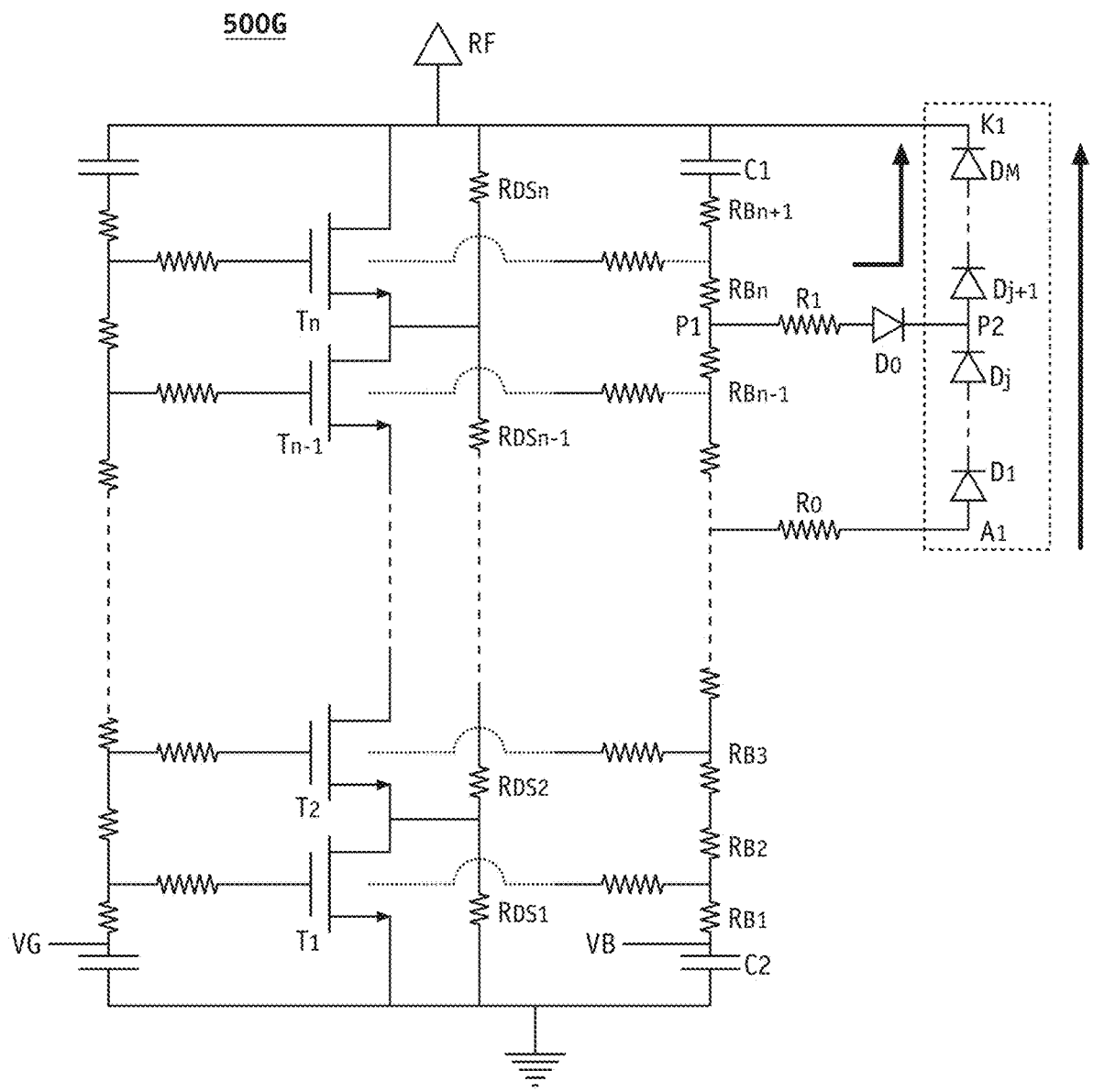
FIGS. 5G-5H, and 6 show exemplary FET switch stacks according to embodiments of the present disclosure.
Figure 5H:
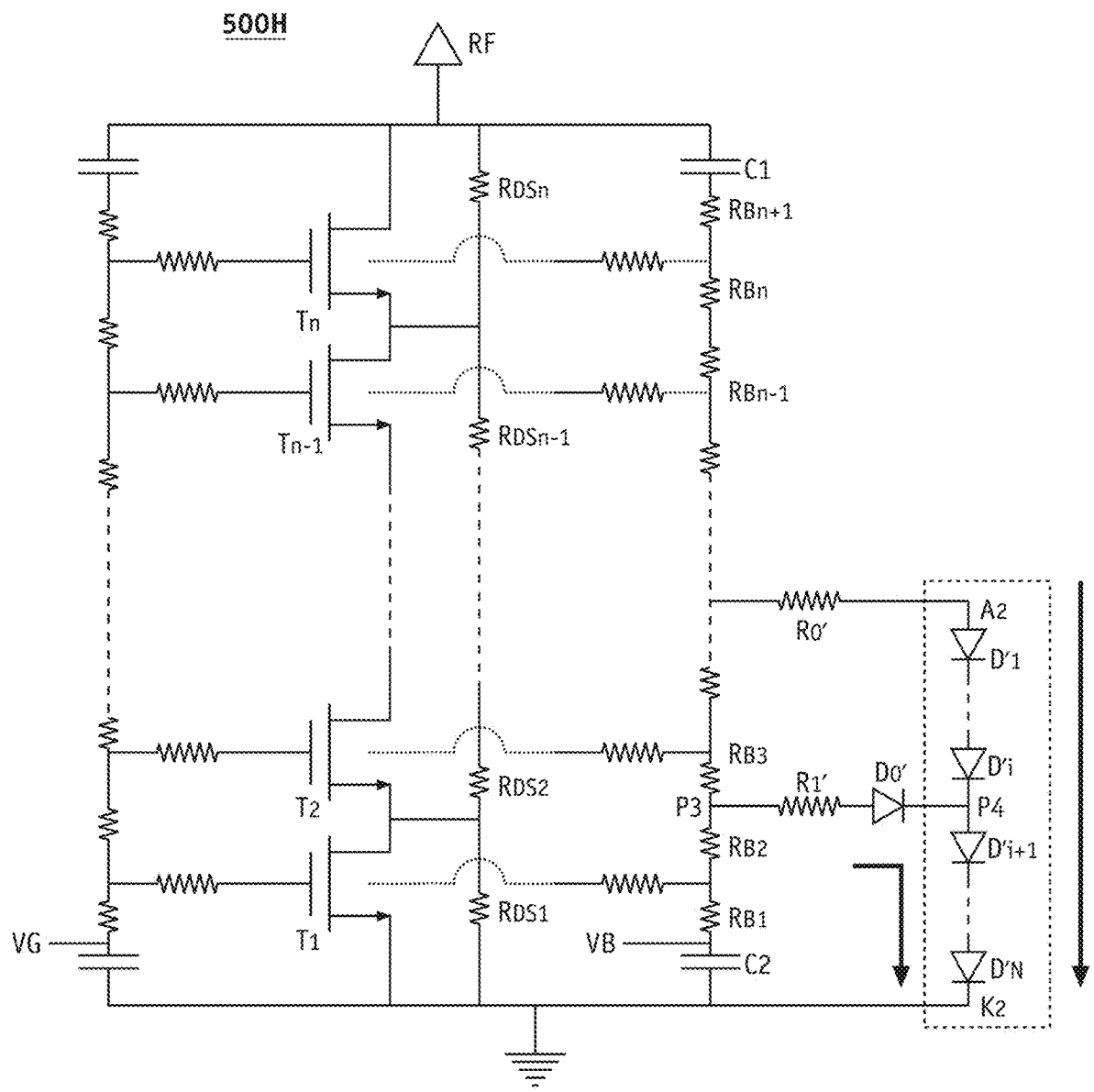

With regards to FET switch stack (500A), embodiments in accordance to the teachings of the present disclosure may also be envisaged where only one of diode stacks (501A, 502A) is present. Examples of such embodiments are given in FIGS. 5G and 5H.

Figure 6:
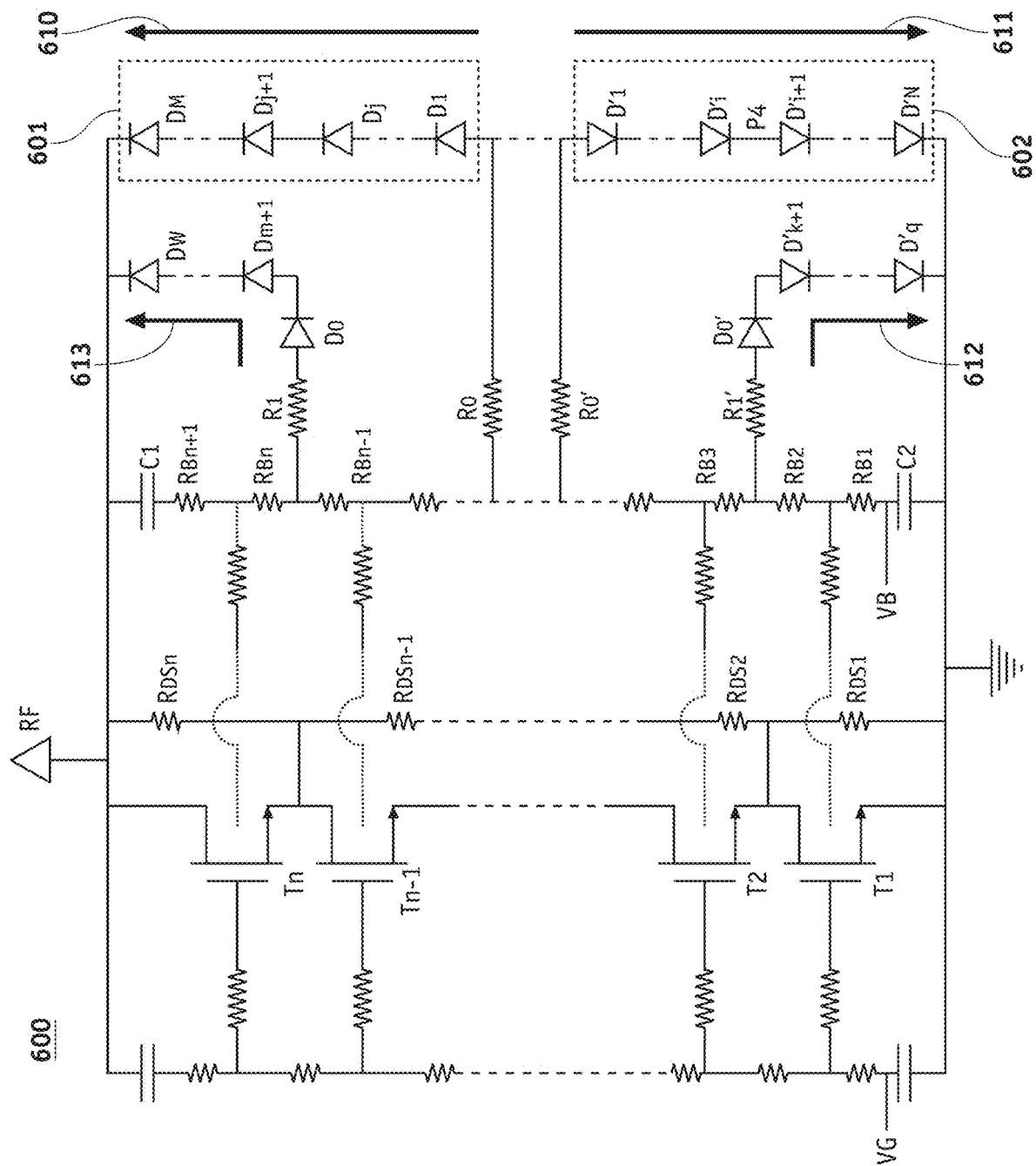

FIG. 6 shows an exemplary FET switch stack (600) in accordance with a further embodiment of the present disclosure. The principle of operation of FET switch stack (600) is similar to what was disclosed with regards to FET switch (500A) of FIG. 5A except that resistor-diode pair (R1, D0) is not connecting to a node within diode stack (601) but instead, such pair is coupled to RF port (RF) through a separate series stack of diodes (Dm+1, . . . , Dw). Similarly, resistor-diode pair (R1', D0') is not connecting to a node within diode stack (401) but instead, such pair is coupled to ground (or a bottom RF port) through a separate series stack of diodes (D'k+1, . . . , D'q). Elements (601, 602, 610, 611, 612, 613) are counterpart of elements (501A, 502A, 510A, 511A, 512A, 513A) of FIG. 5A respectively. All of the previously described teachings with regards to FIGS. 5A-5H are equally applicable to the embodiment of FIG. 6.

Figure 7:
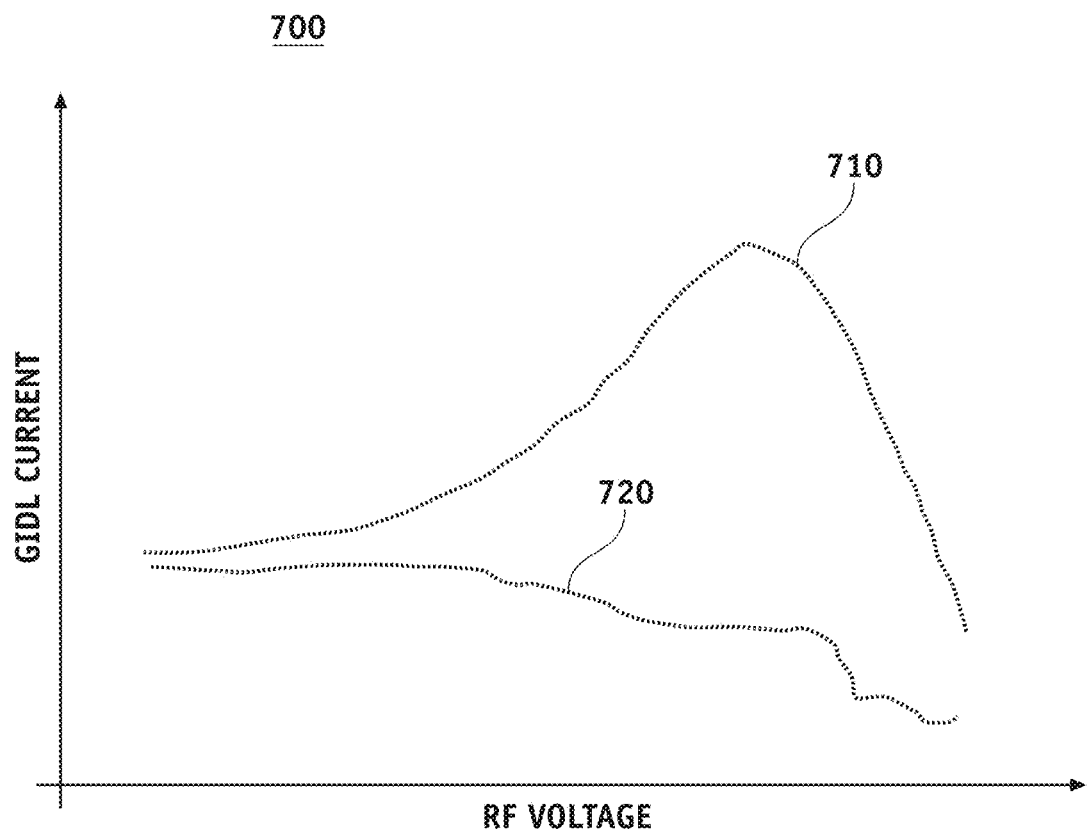
FIG. 7 shows an exemplary graph according to embodiments of the present disclosure.

FIG. 7 shows an exemplary graph (700) according to an embodiment of the present disclosure, illustrating the variations of GIDL current vs. the applied RF amplitude before and after the application of the teachings described in FIGS. 5A-5H and 6. Curve (710) corresponds to the case where only one discharge path is implemented. FET switch stack (200A) of FIG. 2A is an example for this case. On the other hand, curve (720) represents the case where two current discharge paths are implemented by the addition of one resistor-diode pair coupling a node on the body resistor ladder to a respective node within the diode stack. FET switch stack (500A) of FIG. 5A is an example for this case. As can be seen, by virtue of adding an additional discharge path using a resistor-diode pair, the GIDL current has been suppressed and relatively flattened. The presence of such additional path has the ability to result in an improvement in the non-linear performance of the switch stack and has the ability to provide a more balanced distribution of voltages across the stack.

Figure 8:
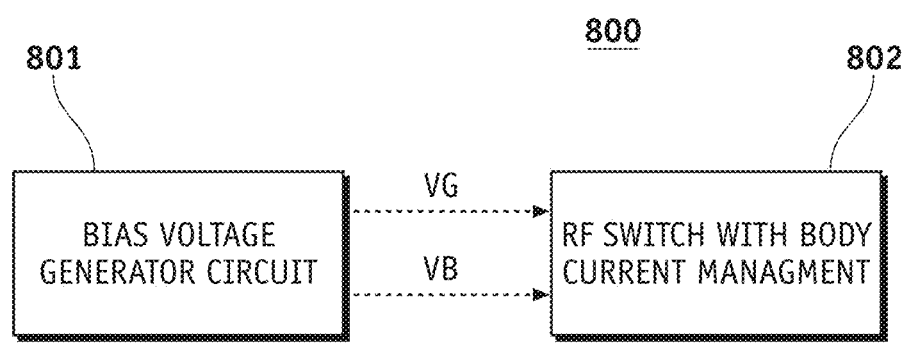
FIG. 8 shows the block diagram of an exemplary RF circuit according to an embodiment of the present disclosure.

With reference to RF switch (200A) of FIG. 2A and RF switch (500A) of FIG. 5A, as mentioned previously, bias voltages (VB, VG) are generated by a bias voltage generator circuit which was not shown on FIGS. 2A, and 5A for the sake of simplicity. FIG. 8 shows an RF circuit (800) representing RF switches (200A, 500A) wherein bias voltage generator circuit (801) is shown as separated from the core of such RF switches. Through the disclosure the term "body current management" refers to a mechanism of counteracting the undesired GIDL current. As an example, referring to FIG. 2A, a combination of diode stacks (201, 202) provide such mechanism. As a further example, referring to FIG. 5A, such mechanism is provided by a combination of resistor-diode pair (R1, D0), resistor (R0) and diode stack (501A), resistor-diode pair (R1', D0'), resistor (R0') and diode stacks (511A). As shown in RF circuit (800), element (802) represents an RF switch (e.g. RF switch stack (500A) of FIG. 5A, or RF switch stack (200A) of FIG. 2A) receiving bias voltages (VB, VG) from bias voltage generator circuit (801). As also shown in RF circuit (800), bias voltage generator circuit (801) is also a source of current (Iss) representing the current sourced by bias voltage generator circuit (801) due to the undesired GIDL current.

With further reference to RF switches (200A, 500A) of FIGS. 2A and 5A, as mentioned previously, the more negative bias voltage (VB) is during the OFF state of an RF switch, the better the overall linearity performance of such switch will be. However, this comes with the price of a more complex design for a bias voltage generator circuit (801) like the one generally shown in FIG. 8, occupying more space and consuming more power. On the other hand, implementing a more compact design of bias voltage generator circuit (801) can undesirably result in a degraded non-linear performance and worse power handling capability of the RF switch.

An exemplary value for bias voltages (VB, VG) is −3V when the RF switch stack is in OFF state. According to some embodiments of the present disclosure, RF switches may be envisaged where a less negative bias voltage (VB), e.g. −2V, may be provided to the RF switch stack during its OFF state. Body current management in such embodiments may be implemented such that, at least when applying higher RF signal amplitudes, the body bias voltages of transistors within the FET switch stack are charge pumped by the RF signal to more negative voltages (e.g. −3V) than what is provided, e.g. −2V, by bias voltage generator circuit (801). As a result, more compact bias voltage generator circuits (801) with less DC power consumption can be implemented without compromising the non-linear performance and the power handling capability of the RF switch stack. In other words, by virtue of implementing the diode-based body current management methods disclosed so far as part of the RF switch stack design, the use of a smaller, less complex and cheaper bias voltage generator circuit is made possible without hurting the overall linearity performance of the RF switch stack.

Previously known switch stacks in the OFF state may require the same body and gate bias voltages (i.e. VB=VG). There are several reasons for such arrangement. First, it is generally easier to design only one negative supply voltage than more. Second, the choice of more negative values for the bias voltage (VG) will put the FET deeper into the OFF state, which in turn results in an improved power handling. Finally, a more negative value of bias voltage (VB) will result in an improved linearity. Differently from such general statement, one of the benefits of the teachings disclosed herein is that, by including body current methods as disclosed in the design of switch stacks the amount of negative bias voltage requirement is reduced (relaxed) without having any impact on power handling requirements. Moreover, as mentioned previously, such switch stacks benefit from better linearity performance when a more negative body bias voltage is applied. This is made possible, without having to design for bias voltages with more negative values, by the teachings of the disclosure as the body bias voltages of transistors within the FET switch stack are charge pumped by RF signal to more negative voltages than what is provided by the bias voltage generator circuit. The person skilled in the art will appreciate that the approach according to the present disclosure is counter-intuitive because it requires separate and different treatment of the gate bias voltage and the body bias voltage in the OFF condition of the FET switch, and thus added control logic efforts. On the other hand, the inventors have found that such counter-intuitive approach brings to the above outlined advantages and benefits.

In view of the above, with further reference to FIGS. 2A and 5A, and in accordance with the teachings of the present disclosure, embodiments may be provided where:
- bias voltages (VB, VG) are not equal
- body bias voltage (VB) is less negative than gate bias voltage (VG)
- body bias voltage (VB) is less negative than gate bias voltage (VG) by at least 1 V
- body bias voltage (VB) is adjustable
- body bias voltage (VB) is adjusted based on a desired overall non-linear performance and/or power handling requirement of the FET switch stack
- body bias voltage (VB) is adjusted in correspondence with the number of diodes in diode stacks (201, 202) of FIG. 2A or diode stacks (501A, 502A) of FIG. 5A and/or the position of such diode stacks within their respective RF switch stacks.

Figure 9:
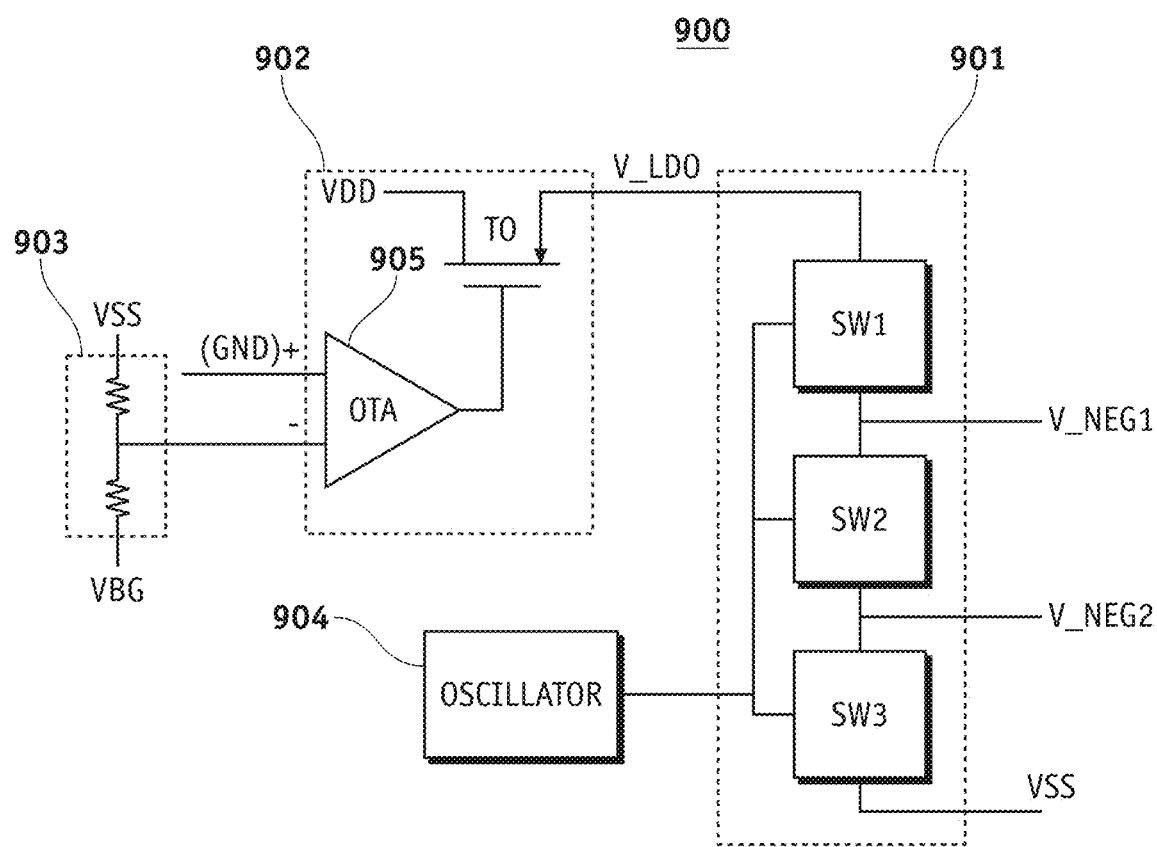
FIG. 9 shows a bias generation circuit.
Figure 10:
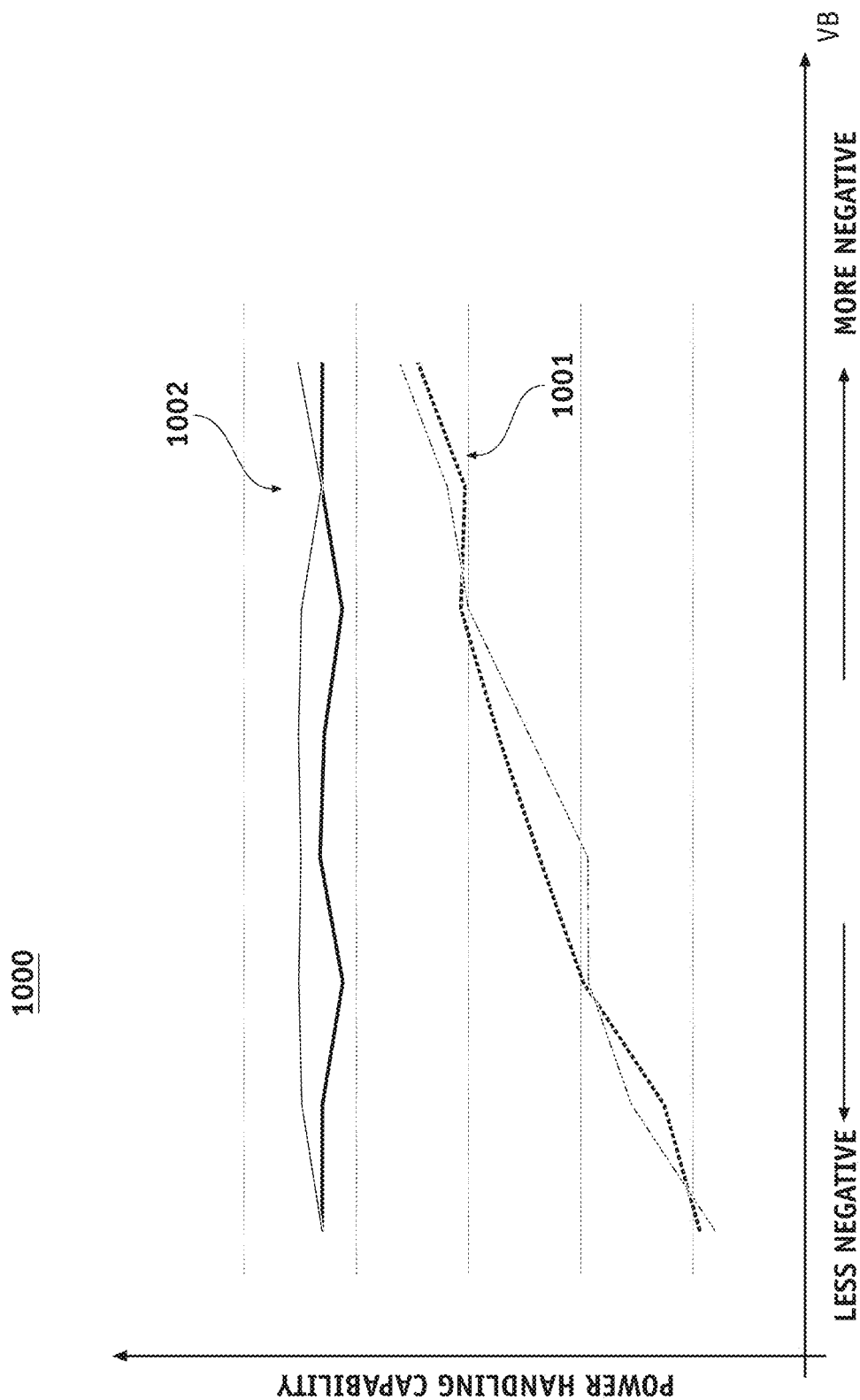
FIGS. 10-11 show exemplary graphs according to embodiments of the present disclosure.

FIG. 9 shows a bias voltage generator circuit (900) according to an embodiment of the present disclosure. Bias voltage generator circuit (900) is an exemplary implementation of the bias voltage generator circuit (801) of FIG. 8 and comprises a multi-stage charge pump switch block (901), (LDO) low drop-out voltage converter (902), resistor divider (903), and oscillator (904). Multi-stage charge pump switch block (901) includes charge pump switches (SW1, SW2, SW3). LDO (902) includes (OTA) operational transconductance amplifier (905) connected to transistor (T0). In operative conditions, different negative voltage levels (V_NEG1, V_NEG2, VSS) in decreasing order (i.e. from less negative to more negative) are generated at the outputs of charge pump switches (SW1, SW2, SW3) respectively. In other words, V_NEG1 is the least and VSS is the most negative bias voltage generated by this circuit.

As also shown in FIG. 9, the negative voltage (VSS) is fed back to a first input of OTA (905) through the top end of resistor divider (903). The bottom end of resistor divider (903) receives a reference voltage (VBG) which can be generated, for example, as a bandgap reference voltage circuit (not shown). Based on the difference between the voltage received at its first input and the reference voltage (e.g. ground) at its second input, OTA (905) generates a signal at its output to control the conductivity of transistor (T0) thus regulating voltage (V_LDO) applied to the input of charge pump switch block (901). Oscillator (904) comprises a variable rate clock served to adjust to output current supply of bias voltage generator circuit (900).

With reference to FIGS. 2A, 5A, and FIGS. 8-9, according to an embodiment of the present disclosure, any of the output bias voltages (V_NEG1, V_NEG2) may be used as body bias voltage (VB), while negative voltage (VSS) may be used as gate bias voltage (VG) for any of the circuits shown in the previous FIGS. 2A, 5A, 5G, 5H and 6 of the present application. In what follows, some exemplary graphs will be shown to further highlight the benefits of the above-disclosed methods of setting the body bias voltage to less negative voltage values while implementing the body current management techniques previously shown in FIGS. 2A, 5A, 5G, 5H and 6.

Figure 1A:
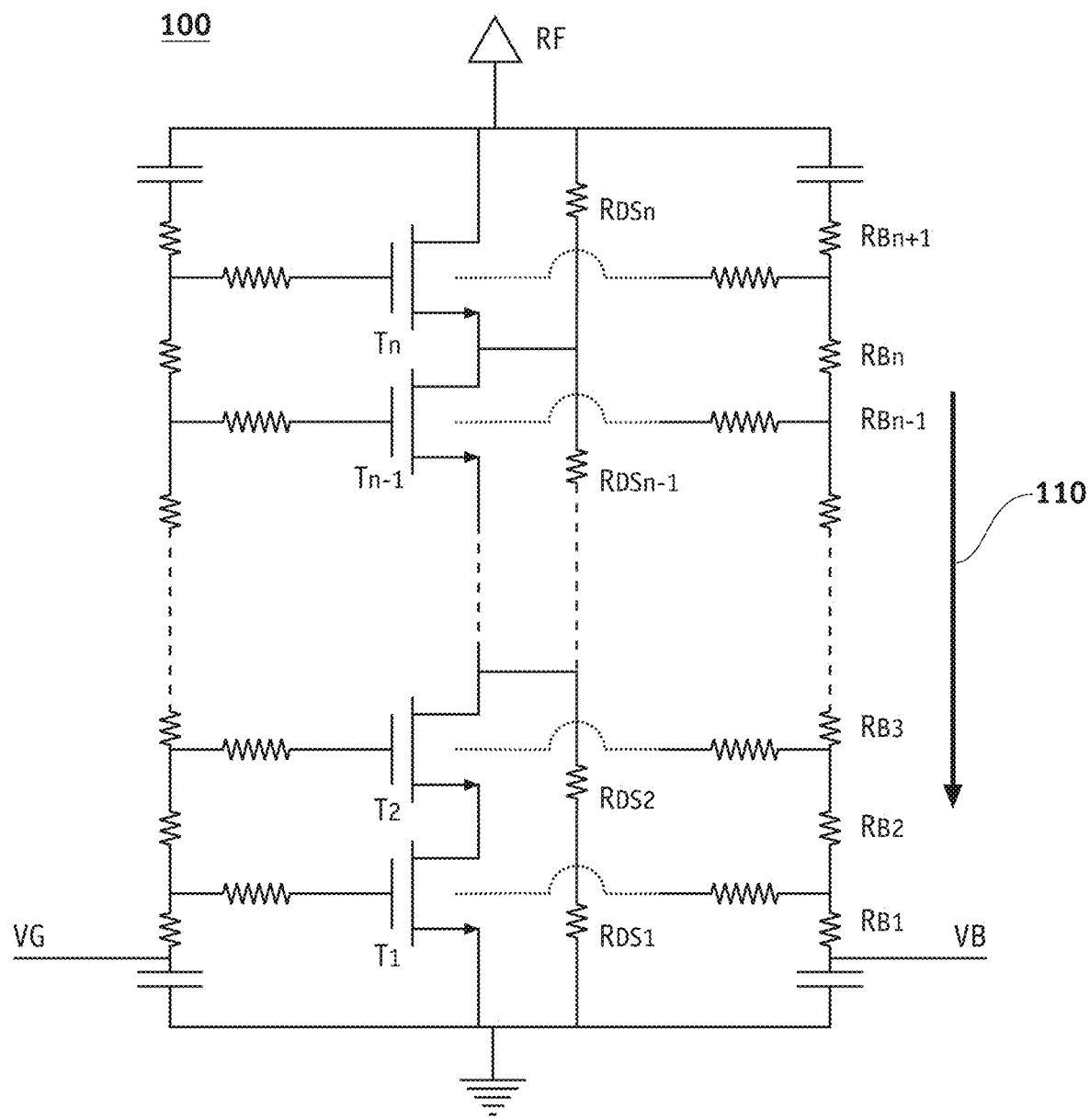
FIG. 1A shows a prior art FET switch stack.
Figure 1B:
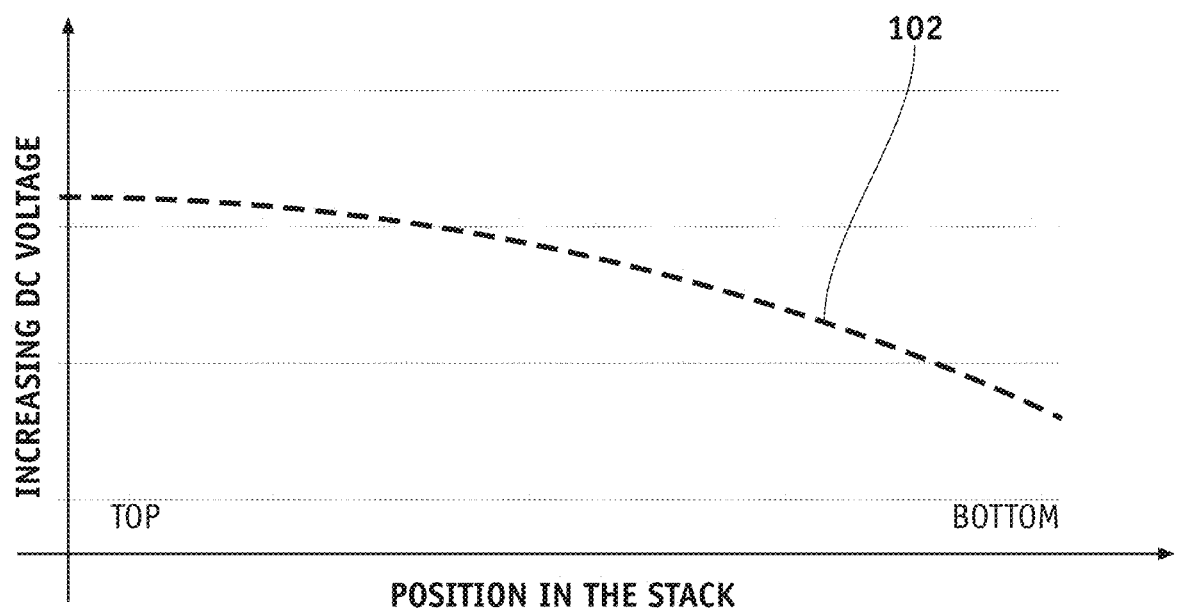
FIG. 1B shows a prior art average DC voltage profile for bodies of the transistors of a switch stack vs. position of such transistors within the stack when the FET switch stack is in the OFF state.

With further reference to FIGS. 2A, 5A, and 8-9, FIG. 10 shows graphs (1000) including two set of curves (1001, 1002) representing performance results obtained without and with implementing body current management, respectively. Curves (1001) represent the dependency of power handling FET switches on body bias voltage (VB) without implementing body current management. An example for this case is the FET switch stack (100) of FIG. 1A. As can be seen, with increasing body current bias voltage to less negative values during the OFF state of the FET switch, the performance degrades and the FET switch shows lower power handling capability. Throughout the document, the term "power handling capability" refers to the maximum power applied to a switch stack in an OFF state with a given configuration (e.g. series or shunt) and RF port impedance termination (e.g. open or 50 Ohm) without causing any switch breakdown. On the other hand, curves (1002) represent the case where body current management in accordance with the teachings of the present disclosure is implemented. Exemplary FET switch stacks for this case are FET switch stacks (200A, 500A) of FIGS. 2A and 5A respectively. As can be noticed, the power handling capability has improved after implementing body current management, and more in particular, the dependency of the power handling capability of the RF switch stack in this case is removed (i.e. the 1002 curves are relatively flat) with respect to the applied bias voltage (VB), confirming the fact that the FET switch stacks in this case can benefit from the counter-intuitive teachings of the present disclosure without sacrificing power handling requirements. Each of the curves (1001, 1002) include two separate plots each corresponding to a different switch stack showing part to part variation.

Figure 11:
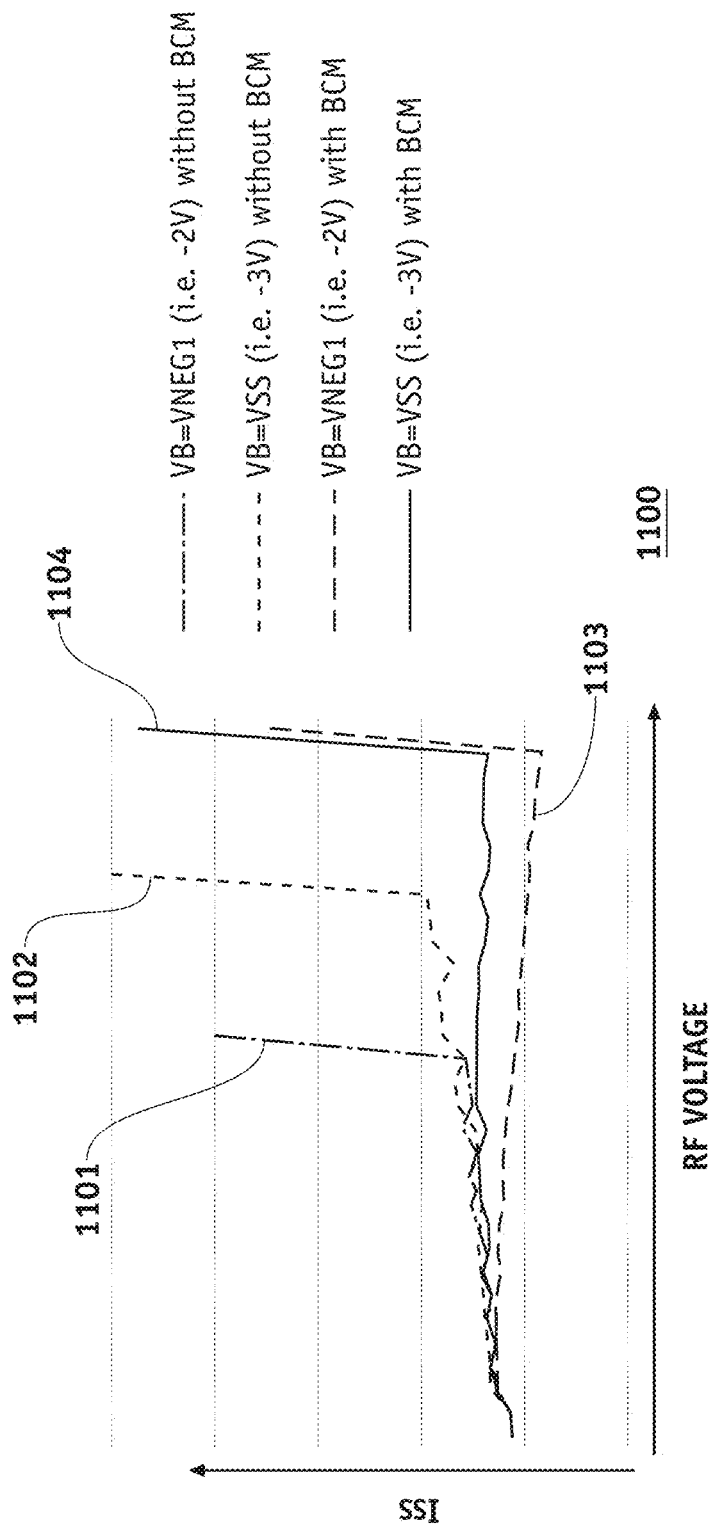

FIG. 11 shows graphs (1100) including four sets of curves (1101, 1102, 1103, 1104) representing performance results obtained without and with implementing body current management as well as with VB being less negative than VSS. Curve (1101) represents the exemplary variation of body current (Iss) FET switches vs. RF peak voltage without implementing anybody current management and bias voltage VB is connected to a voltage less negative than VSS in bias generator rail. i.e. VNEG1. Curve (1102) represents the exemplary variation of body current (Iss) FET switches vs. RF peak voltage without implementing any body current management and, with bias voltage VB being connected to VSS. Curve (1103) represents the case where body current management in accordance with the teachings of the present disclosure is implemented and bias voltage VB is connected to a voltage less negative than VSS in bias generator rail, i.e. VNEG1. Curve (1104) represents the case where body current management in accordance with the teachings of the present disclosure is implemented and bias voltage VB is connected to VSS. As can be noticed, for curve (1103) the maximum Iss that bias generator needs to handle has reduced as compared to curves (1101, 1102, 1104) hence reducing complexity and power consumption requirements of bias generator.

Figure 12:
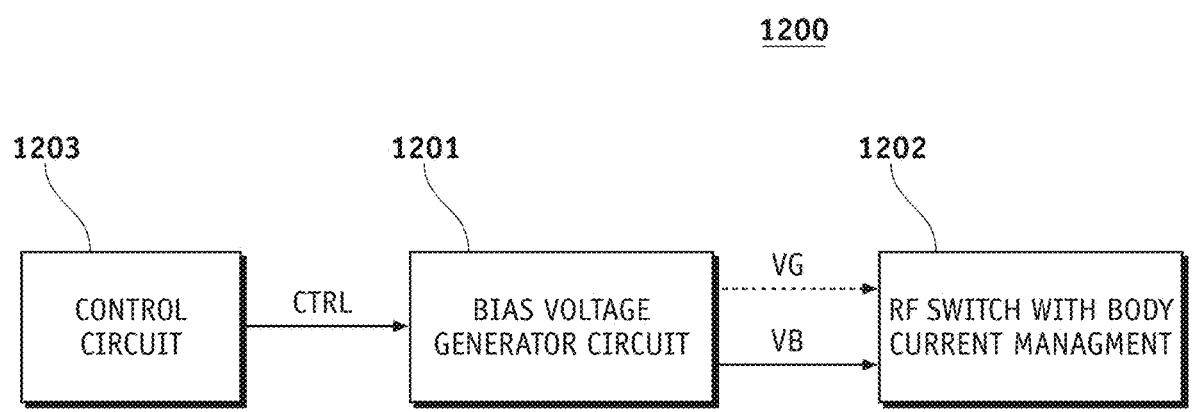
FIG. 12 shows the block diagram of an exemplary RF circuit according to an embodiment of the present disclosure.

FIG. 12 shows an exemplary RF circuit (1200) according to an embodiment of the present disclosure. The principle of operation of RF circuit (1200) is similar to what was described with regards to RF circuit (800) of FIG. 8 except for the addition of control circuit (1303). In operative conditions, when RF switch (1202) is in OFF state, depending on the desired linearity performance of the RF switch (1202), control circuit (1203) may issue control signal (CTRL) to indicate what level of body bias voltage (VB) is required to be provided to RF switch (1202) by bias voltage generator circuit (1201).

As already noted before, the bias voltage (VB) can be adjusted during the OFF state of the RF switch. In particular, As the RF power is decreased, adjusting (VB) more negative towards the optimal body voltage target voltage when the diodes are not conducting can be useful in order to maintain linearity in off-mode, and good small signal isolation. In this backed-off condition, the body current to be managed is usually not large. In such case, (VB) can be adjusted by either variable or discrete steps. The adjustability can be controlled, for example, by an analog control, digital control register, or the decoded output of an RF detector which adjusts the voltage as a function of RF power applied to the switch in off-mode.

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A field effect transistor (FET) switch stack comprising:
    serially connected FETs coupled at one end to a first terminal and at another end to a second terminal, the first terminal being configured to receive a radio frequency (RF) signal;
    a body resistor ladder coupled to the first terminal, the body resistor ladder comprising a plurality of body resistor elements connected in series, each body resistor element coupled across body terminals of corresponding adjacent FETs of the serially connected FETs; and
    a first diode element arrangement comprising:
        i) a diode element stack coupled between a first tapping point of the body resistor ladder and the first terminal, the diode element stack comprising a first diode element and a second diode element connected in series, wherein a cathode of the first diode element is connected to an anode of the second diode element, and
        ii) a third diode element coupled between a second tapping point of the body resistor ladder and the anode of the second diode element, the third diode element having a cathode coupled to the cathode of the first diode element and the anode of the second diode element.

2. The FET switch stack of claim 1, wherein the diode element stack is configured to provide a first gate-induced drain leakage (GIDL) current discharge path during an OFF state of the FET switch stack.

3. The FET switch stack of claim 2, wherein the third diode element is configured to provide at least a second GIDL current discharge path during the OFF state of the FET switch stack.

4. The FET stack of claim 3, wherein the diode element stack and the third diode element are configured to be in a conductive state and provide the first GIDL current discharge path and the at least second GIDL current discharge path in combination during a portion of a positive or negative swing of the RF signal in the OFF state of the FET switch stack.

5. The FET switch stack of claim 3, wherein at least one of the first or second diode elements of the diode element stack is coupled to the body resistor ladder through at least one coupling resistor.

6. The FET switch stack of claim 5, wherein the coupling resistor serves as a current limiting resistor during the portion of the positive or negative swing of the RF signal when the first GIDL current discharge path and the at least second GIDL current discharge path are provided in combination.

7. The FET switch stack of claim 6, wherein the diode element stack and the third diode element are coupled to the body resistor ladder through respective coupling resistors.

8. The FET switch stack of claim 1, wherein the diode element stack and the first and second diode elements are coupled to the body resistor ladder at different tapping points of the body resistor ladder.

9. The FET switch stack of claim 6, wherein the diode element stack, the third diode element and the at least one coupling resistor are configured to i) start providing the first GIDL current discharge path before starting providing the at least second GIDL current discharge path and ii) stop providing the first GIDL current discharge path after stopping providing the at least second GIDL current discharge path during the positive or negative swing of the RF signal in the OFF state of the FET switch stack.

10. The FET switch stack of claim 6, wherein the third diode element is configured to provide the at least second GIDL current discharge path in combination with a subset of diode elements of the diode element stack, whereby the second GIDL discharge path partially overlaps with the first GIDL discharge path.

11. The FET stack of claim 6, wherein the third diode element is configured to provide the at least second GIDL discharge path without combination with a subset of diode elements of the diode element stack, whereby the second GIDL discharge path is separate from the first GIDL discharge path.

12. The FET switch stack of claim 6, further comprising a second diode element arrangement with a corresponding diode element stack and a fourth diode element, wherein
    the diode element stack of the first diode element arrangement and the the third diode element are configured to provide the first GIDL current discharge path and the at least second GIDL current discharge path in combination during a portion of the positive swing of the RF signal in the OFF state of the FET switch stack, and
    the fourth diode element is configured to be in a conductive state and provide the first GIDL current discharge path and the at least second GIDL current discharge path in combination during a portion of the negative swing of the RF signal in the OFF state of the FET switch stack.

13. The FET switch stack of claim 1, configured to receive a first bias voltage at a gate bias terminal of the FET switch stack and a second bias voltage at a body bias terminal of the FET switch stack.

14. The FET switch stack of claim 13, wherein, in the OFF state of the FET switch stack, the first bias voltage and the second bias voltage are negative bias voltages.

15. The FET switch stack of claim 1, wherein the second terminal is configured to be coupled to a reference voltage or ground.

16. The FET switch stack of claim 1, wherein the second terminal is configured to be coupled to a RF signal.

17. The FET switch stack of claim 1, wherein at least one of the diode element stack and the third diode element comprises diode-connected transistors or diodes.

18. The FET switch stack of claim 1, further comprising a first capacitor coupling the body resistor ladder to the first terminal and a second capacitor coupling the body resistor ladder to the second terminal.

19. A method of controlling a gate induced drain leakage current in an OFF state of a radiofrequency (RF) switch stack, the RF switch stack including i) serially connected FETs configured to receive an RF signal, ii) a body resistor ladder coupled to body terminals of the serially connected FETs, iii) a diode element stack coupled between a first tapping point of the body resistor ladder and the first terminal, the diode element stack comprising a first diode element and a second diode element connected in series, wherein a cathode of the first diode element is connected to an anode of the second diode element, and iv) a third diode element coupled between a second tapping point of the body resistor ladder and the anode of the second diode element, the third diode element having a cathode coupled to the cathode of the first diode element and the anode of the second diode element; the method comprising:
    applying the RF signal to the RF switch stack;
        generating a first current discharge path for the gate induced drain leakage current through the body resistor ladder during a first time interval in the OFF state of the RF switch stack; and generating a second current discharge path for the gate induced drain leakage current through the body resistor ladder during a second time interval in the OFF state of the RF switch stack, wherein:
- the second time interval partially overlaps in time with the first time interval during a first overlap time interval in the OFF state of the RF switch where both the first current discharge path and the second current discharge path are generated; and
- the first current discharge path is generated through the diode element stack and the second current discharge is generated through the third diode element.

20. The method of claim 19, wherein the diode element stack and the third diode element are coupled to the body resistor ladder at different tapping points of the body resistor ladder.

21. The method of claim 19, further comprising generating a third current discharge path for the gate induced drain leakage current through the body resistor ladder during a third time interval in the OFF state of the RF switch stack, wherein the third time interval partially overlaps in time with the first time interval and the second time interval during a second overlap time interval in the OFF state of the RF switch where the first current discharge path, the second current discharge path and the third current discharge path are generated.

22. The FET switch stack of claim 1, wherein one or more body resistor elements of the body resistor ladder are connected in series between the first tapping point and the second tapping point.

* * * * *